(12) United States Patent
Srinivasan et al.

(10) Patent No.: US 6,744,652 B2
(45) Date of Patent: Jun. 1, 2004

(54) CONCURRENT SEARCHING OF DIFFERENT TABLES WITHIN A CONTENT ADDRESSABLE MEMORY

(75) Inventors: Varadarajan Srinivasan, Los Altos Hills, CA (US); Sandeep Khanna, Santa Clara, CA (US)

(73) Assignee: Netlogic Microsystems, Inc., Mountain View, CA (US)

(*) Notice: Subject to any disclaimer, the term of this patent is extended or adjusted under 35 U.S.C. 154(b) by 26 days.

(21) Appl. No.: 09/935,997

(22) Filed: Aug. 22, 2001

(65) Prior Publication Data

US 2003/0039135 A1 Feb. 27, 2003

(51) Int. Cl.[7] .............................................. G11C 15/04
(52) U.S. Cl. .................................... 365/49; 365/230.03
(58) Field of Search ............................ 365/49, 230.03; 711/108

(56) References Cited

U.S. PATENT DOCUMENTS

| | | |
|---|---|---|
| 3,648,254 A | 3/1972 | Beausoleil |
| 4,845,668 A | 7/1989 | Sano et al. ................... 365/49 |
| 4,958,377 A | 9/1990 | Takahashi ................... 382/34 |
| 4,996,666 A | 2/1991 | Duluk, Jr. |
| 5,319,762 A | 6/1994 | Mayer ......................... 395/425 |
| 5,414,704 A | 5/1995 | Spinney ....................... 370/60 |
| 5,444,649 A | 8/1995 | Nemirovsky |
| 5,642,322 A | 6/1997 | Yoneda .................. 365/230.03 |
| 5,860,085 A | 1/1999 | Stormon et al. ............. 711/108 |
| 5,870,324 A | 2/1999 | Helwig et al. ................. 365/49 |
| 5,956,336 A | 9/1999 | Loschke et al. |
| 5,978,885 A | 11/1999 | Clark, II |
| 6,041,389 A | 3/2000 | Rao |
| 6,069,573 A | 5/2000 | Clark, II et al. |
| 6,081,440 A | 6/2000 | Washburn et al. |
| 6,081,442 A | 6/2000 | Igarashi et al. ............... 365/49 |
| 6,098,147 A | 8/2000 | Mizuhara .................... 711/108 |
| 6,161,144 A | 12/2000 | Michels et al. ............. 709/238 |
| 6,226,710 B1 | 5/2001 | Melchior .................... 711/108 |
| 6,324,087 B1 * | 11/2001 | Pereira ......................... 365/49 |
| 6,353,873 B1 | 3/2002 | Melchior |
| 6,374,326 B1 | 4/2002 | Kansal et al. |

OTHER PUBLICATIONS

U.S. Patent Application, Publication No. US 2002/0126672 A1, Published Sep. 12, 2002.
U.S. Patent Application, Publication No. 2002/007446 A1, Published Jan. 17, 2002.
US Patent Application, Publication No. US 2002/0073073 A1, Published Jun. 13, 2002.

* cited by examiner

Primary Examiner—Richard Elms
Assistant Examiner—Jung H. Hur
(74) Attorney, Agent, or Firm—Blakely, Sokoloff, Taylor & Zafman, LLP

(57) ABSTRACT

A method and apparatus are described for the filtering of a common input string to generate various filtered comparand strings. The filtering of a common input string enables concurrent lookups in different tables to be performed on multiple filtered comparands by different CAM devices (or different blocks within a CAM device), to compare the data in the filtered comparand strings with data stored in its associative memory. By performing multiple lookups in parallel, rather than sequentially, packet throughput in a CAM may be significantly increased.

50 Claims, 24 Drawing Sheets

CONCURRENT SEARCHING OF DIFFERENT TABLES WITHIN A CONTENT ADDRESSABLE MEMORY

FIELD OF THE INVENTION

This invention relates to the field of memory devices and, in particular, to content addressable memory devices.

BACKGROUND OF THE INVENTION

Networks may contain a collection of computing systems (e.g., clients and servers) that are interconnected by transmission lines to enable the transfer of data between them. A network typically includes multiple access points (e.g., routers and servers) that may switch and/or route data between transmission lines to transfer data from a source to a destination. Data is typically transmitted in the form of packets that are made up of smaller data cells. A packet is a unit of data that is routed between a source and a destination on a packet-switched network. When a file (e.g., e-mail, graphics, etc.) is sent from one place to another on a network, the file is divided into such smaller packets making them more efficient for transmission. The individual packets for a given file may travel different routes throughout networks with each packet containing both data and transmission information associated with the routing of data. As such, a packet may be described as having a payload containing the data, and one or more headers that contain the routing information (e.g., a destination address).

When all the packets have arrived at a destination, they are reassembled into the original file at the receiving end. Such a packet switching scheme is an efficient way to handle transmission on a connectionless network. This is in contrast to a circuit switching scheme where a connection (e.g., a voice connection) requires the dedication of a particular path for the duration of the connection.

A router is a device (e.g., hardware, firmware, software) that determines the next network segment to which a packet should be forwarded towards its destination. A router may be positioned at points within a network or where one network meets another, referred to as a gateway. A router may create and maintain tables of the available routes and their conditions for use with other information to determine the best route for a given packet. Typically, a packet may travel through a number of network points having routers before arriving at its destination.

When a data packet arrives at the input of a router, several lookups may be performed to determine the subsequent handling of the packet, as illustrated in FIG. 1. The lookups may include, for examples, where to send the packet next (Next Hop), the quality of service requirement (QoS), the Ethernet port address, etc. Consider, for example, a packet arriving at Router-A. Router-A needs to determine whether the packet is destined for local servers connected directly to Router-A, or if the packet should go to the next router on a route (Router-B) to a destination. Additionally, Router-A may assign a priority based on the destination address (DA) and the source address (SA) of the packet.

The packet header may first be parsed or processed to get the values from different fields (e.g., SA, DA, protocol type, QoS, etc) in order to perform the various lookups. A packet classification lookup, for example, may be performed using SA, DA and other relevant fields in the packet header. The Next Hop lookup, for example, may also be performed to determine whether the packet is meant for local servers or for Router-B. If the packet is destined for Router-B, the packet is then put in a queue for Router-B. If the packet is destined for a local server (e.g., Server-1 or Server-2), then a media access control (MAC) lookup is performed to send the packet to the appropriate server. In the preceding example, three lookups are necessary for sending the packet on its way: Packet Classification, Next Hop, and MAC. However, often there are other lookups performed on the packet header, with the number of lookups exceeding five or more.

Routers may use processors and content addressable memory (CAM) devices to perform the various lookups on packets. As opposed to a random access memory (RAM) device, in which information is accessed by specifying a particular memory location address, the data stored in a CAM is accessed by the contents of the data. More specifically, instead of using an address to access a particular memory location, a CAM uses a key that contains a portion of the desired contents of a particular memory cell in the memory device. The CAM can be instructed by a processor to compare the key, also referred to as comparand data (e.g., packet header data) with data stored in its associative memory array, as illustrated in FIG. 2. The CAM simultaneously examines all of its entries and selects the stored data that matches the key.

When the entire CAM device, or blocks thereof, is searched simultaneously for a match of the stored data with the key comparand data, the CAM device indicates the existence of a match by asserting a match flag. Multiple matches may also be indicated by asserting a multiple match flag. The CAM device typically includes a priority encoder to translate the matched location into a match address or CAM index and outputs this address to a status register so that the matched data may be accessed. The priority encoder may also sort out which matching memory location has the top priority if there is more than one matching entry.

Data may be represented in the form of strings of binary digits ("bits") having a low ("0") logic state and a high ("1") logic state. Different types of CAMs may be used with different data formats. A binary CAM is designed to operate with "0" and "1" states, while a ternary CAM is designed to operate with "0", "1", and "don't care" states. The bits may be organized into groups such as a word (e.g., 64 or 72 bits wide) and stored in different segments of a CAM. The keys used for different data fields may have different word sizes, for example, the key for a Classification lookup may be 128 bits wide and the key for a Next Hop lookup may be 32 bits wide.

A router may include multiple CAMs, with each CAM having a different table or, alternatively, a single CAM having multiple blocks for each of the different tables, for performing the different lookups. For example, a router may include a 32 bit wide Next Hop CAM, a 128 bit Classification CAM, and a 48 bit MAC CAM. With routers having multiple CAMs, each of the multiple CAMs are typically connected to common buses that are used to communicate the various keys and other input and output data with each of the CAM devices. Similarly, with routers having a single CAM with multiple blocks, each of the blocks is accessed using common buses. Thus, lookups are typically performed sequentially before a packet is processed (e.g., routed to the next destination or classified). Because the buses are shared with so many input and output functions of all the CAMs or CAM blocks, many clock cycles are required to multiplex data on the bus. This generally limits the search rate and overall throughput of conventional CAM devices. As the number of ports, segments, or devices that are supported by routers and as the number of lookups increase, conventional CAM devices and architectures can undesirably limit the system's overall throughput.

SUMMARY OF THE INVENTION

The present invention pertains to a method and apparatus for concurrent searching of different tables in a content addressable memory array.

In one embodiment, the apparatus includes a plurality of content addressable memory blocks each coupled to a corresponding filter circuit. Each of the filter circuits is configured to receive a common input string and transmit a filtered comparand string as compared information to its content addressable memory block. The filter comparand strings may be compacted.

Other features and advantages of the present invention will be apparent from the accompanying drawings, and from the detailed description.

BRIEF DESCRIPTION OF THE DRAWINGS

The present invention is illustrated by way of example and not intended to be limited by the figures of the accompanying drawings.

DETAILED DESCRIPTION

Figure 1:
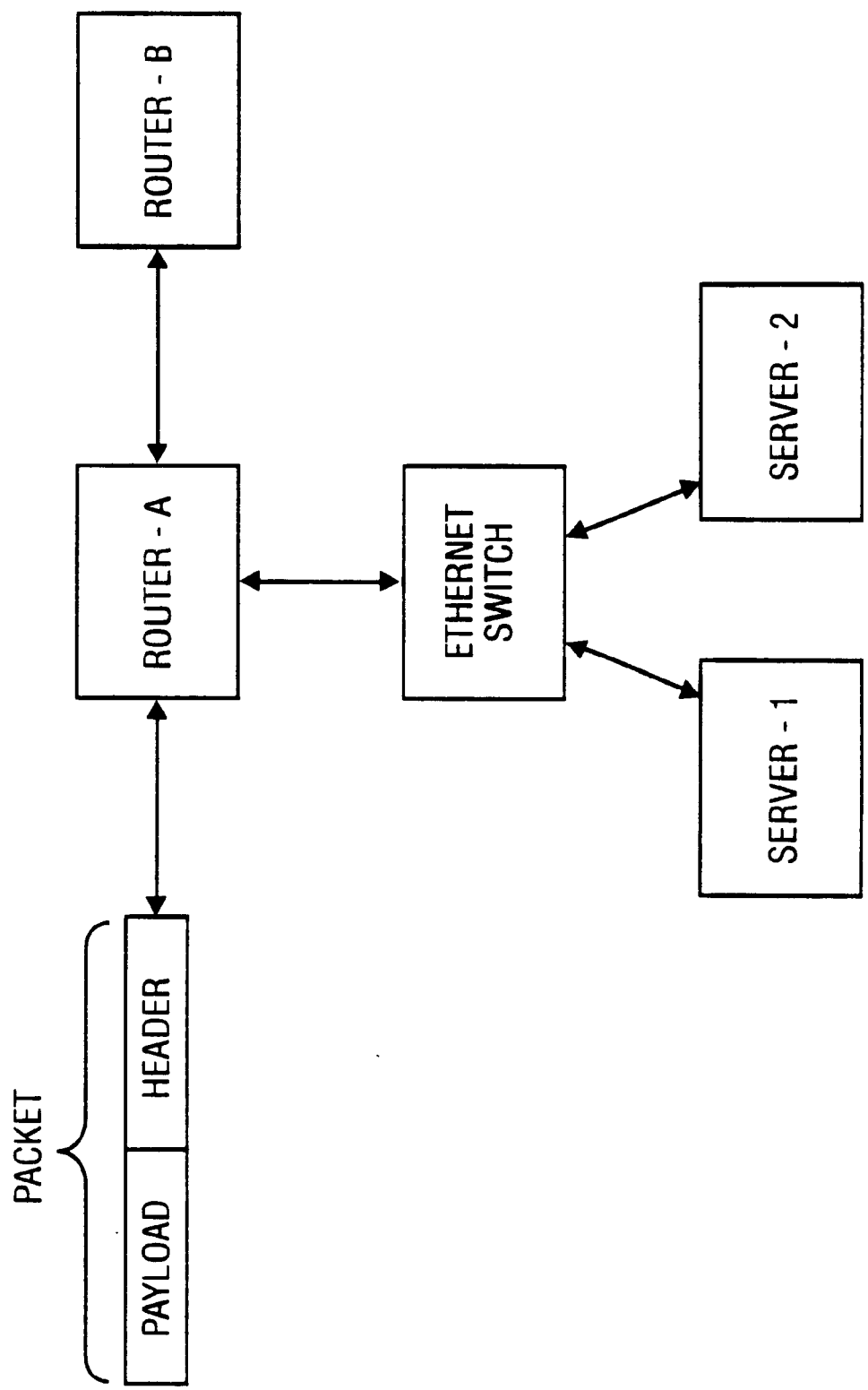
FIG. 1 is a conceptual illustration of packet handling by a router.
Figure 2:
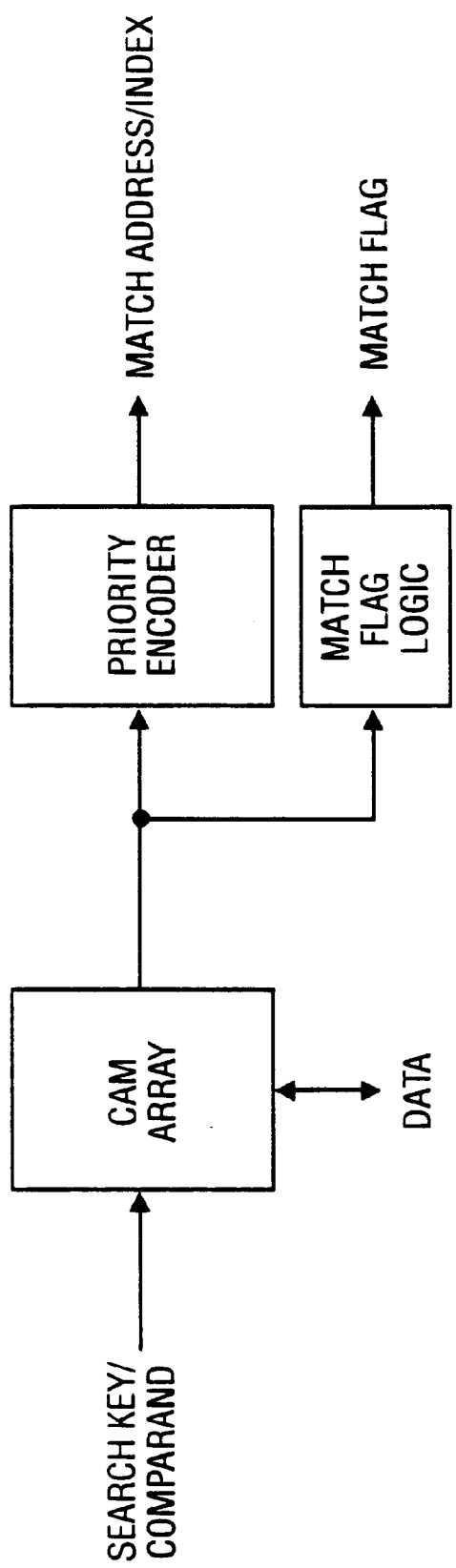
FIG. 2 illustrates one embodiment of a CAM device.

In the following description, numerous specific details are set forth such as examples of specific, components, circuits, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Embodiments of the present invention include various method steps, which will be described below. The steps may be performed by hardware components or may be embodied in machine-executable instructions, which may be used to cause hardware components (e.g., a processor, programming circuit) programmed with the instructions to perform the steps. Alternatively, the steps may be performed by a combination of hardware and software.

Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

The machine readable medium may store data representing an integrated circuit design layout that includes embodiments of the present invention. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

The method and apparatus described herein provides for the filtering of a common input string to generate one or more filtered comparand strings. In one embodiment, the filtering of a common input string enables concurrent lookups in different CAM tables to be performed on multiple filtered comparands by different CAM devices (or different blocks of a CAM device), to compare the data in the filtered comparand strings with data stored in its associative memory. By performing multiple lookups in parallel, rather than sequentially, packet throughput (e.g., in a router) may be significantly increased.

The common input string, including multiple comparand or search key information, may be formed by a controller unit such as a network processor or a central processing unit. In one embodiment, the common input string may include one or more packet headers, or portions thereof. The input string may include various routing data in field segments of the input string that may be used to determine the subsequent handling of the packet, for example, Classification, Next Hop, and MAC. The same input string is passed through different filter circuits. The filter circuits may be preprogrammed to selectively allow one or more segments of the common input string to pass as filtered comparand data to one or more CAM tables.

In one embodiment, the filtering may be performed on a bit basis, where specific predetermined bits are selected from the common input string to generate filtered string segments. The filtered string segments may also be shifted to appropriate bit positions to compact the filtered string segments into a compacted filtered comparand string. The different compacting and/or filtering operations performed on the input string may be performed in parallel, rather than sequentially, such that a filtering operation may be started before another filtering operation is completed. Each of the filtered comparand strings may then be provided to the CAM device blocks. In this manner, all of the CAM device blocks may perform concurrent lookups. Alternatively, the filtering and/or compacting may be performed sequentially and be completed before or performed concurrently with subsequent lookups.

In one embodiment, the filtering and compacting operations may be performed by multiple cross-bar switches that are each under the control of a corresponding programming circuit. The input string is transmitted in parallel to all of the cross-bar switches. Each cross-bar switch may be preprogrammed by its corresponding programming circuit to filter and compact different segments of the input string to generate multiple compacted, filtered comparand strings. The multiple, filtered comparand strings can then be used to perform different lookups using different tables. The compacted, filtered comparand strings may be continuously filled without any gaps between bits. The programming circuit includes, for one example, an address generator, a block filter register, and a data generator. In one embodiment, the cross-bar switches and/or the block filter registers may be implemented with random access memory (RAM) devices.

Figure 3:
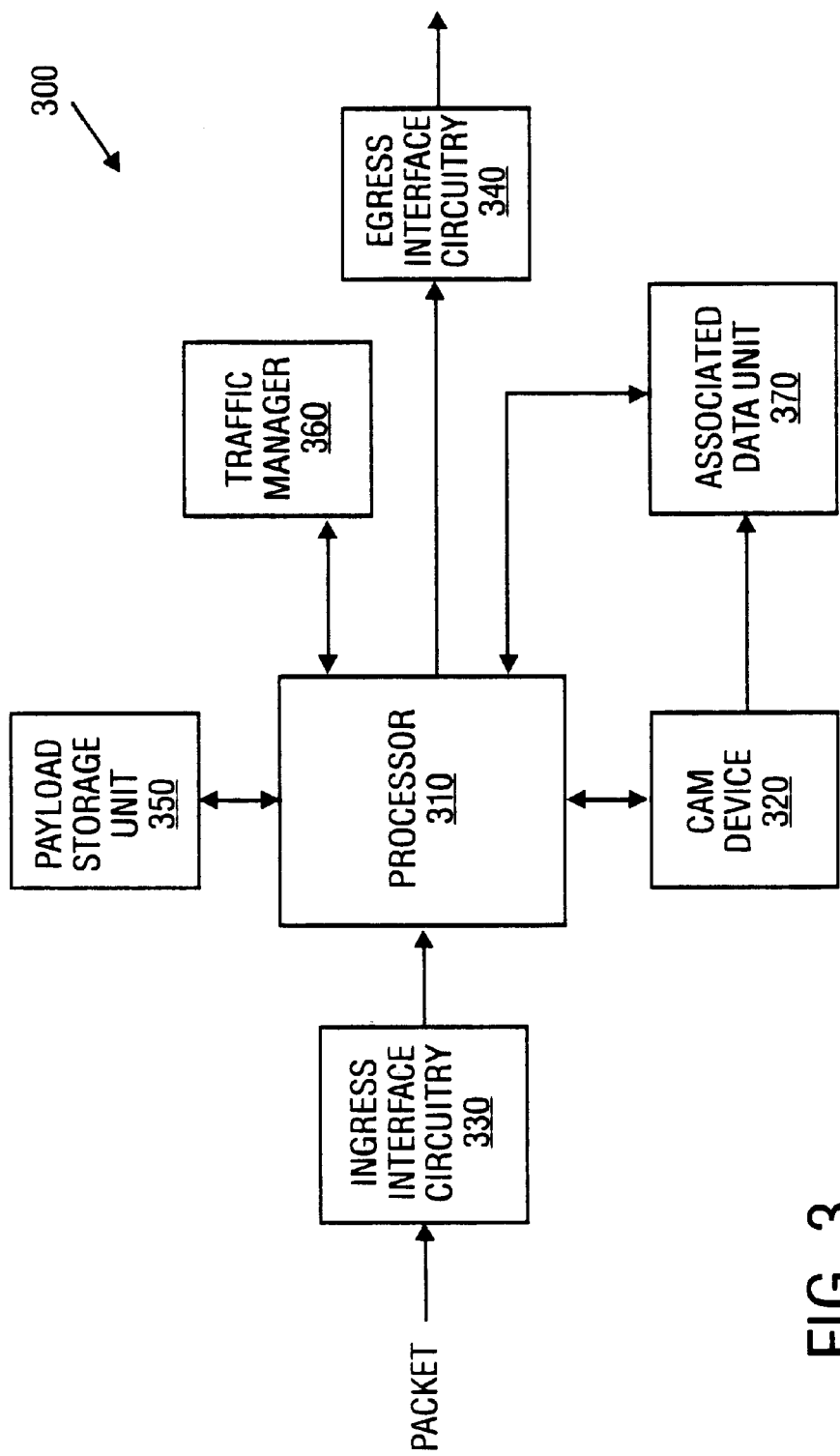
FIG. 3 illustrates one embodiment of a line card or blade of a router having a CAM device configured to perform concurrent lookups.

FIG. 3 illustrates one embodiment of a line card or blade of a router having a CAM device configured to perform concurrent lookups. Line card 300 includes processor 310, ingress interface circuitry 330, egress interface circuitry 340, CAM device 320, associated data storage unit 370, traffic manager 360, and payload storage unit 350.

Processor 310 functions to control the overall operation of line card 300 in cooperation with the other components of line card 300. For example, processor 310 receives packets from a network medium through ingress interface circuitry 330, stores the payload of packets in payload storage unit 350, and processes packet header information to determine required lookups in CAM device 320 and subsequent handling of the packets, as discussed herein. Ingress circuitry includes, for example, PHY and MAC devices. Processor 310 sends out packets on a network medium through egress interface circuitry 340 based on the lookups performed by CAM device 320. Egress interface circuitry 340 may be connected to a switch fabric or directly to one or more other routers or switches. Processor 310 may be one or more network processor units (NPUs), microprocessors, or one or more special purpose processors such as a digital signal processor (DSP). In another embodiment, processor 310 may be another type of controller, for example, a field programmable gate array or a general purpose processor.

The processor 310, ingress interface circuitry 330, and egress interface circuitry 340 components of a router are known in the art; accordingly, a detailed discussion is not provided.

In response to information in a packet header, for a particular packet, processor 310 determines the number and types of lookups to be performed by one or more of CAM devices 320, and forms the search keys for these lookups. The searches or lookups may include, for example, Classification lookups, forwarding lookups (e.g., Next Hop or longest prefix match (LPM) lookup, MAC lookup, MPLS lookup, etc.). When multiple searches are required, processor 310 forms a composite search key that includes at least two, and as many as all, of the various search keys for the lookups. The composite search key is provided as a common input string to CAM device 320. CAM device 320 selectively identifies and extracts the individual search keys from the common input string and provides the individual search keys to the associated CAM blocks to perform the lookups. Advantageously, the lookups can then occur concurrently or simultaneously in the CAM blocks of CAM device 320, thereby increasing overall throughput over conventional systems in which searches are processed sequentially.

CAM device 320 may be a multiple block CAM device with each block capable of storing a different table for comparand lookups, as discussed below in relation to FIGS. 4A and 4B. Alternatively, CAM device 320 may represent multiple, single block CAM devices (e.g., with each single block CAM device formed on a different integrated circuit substrate) with each CAM device used to store a different table for comparand lookup. After one or more lookups are executed in CAM device 320, associated information for matching entries (e.g., additional routing information and/or packet information) may be retrieved from associated data unit 370. Processor 310 then communicates with traffic manager 360 to schedule the exit of a packet from line card 300 via egress interface circuitry 340.

Figure 4A:
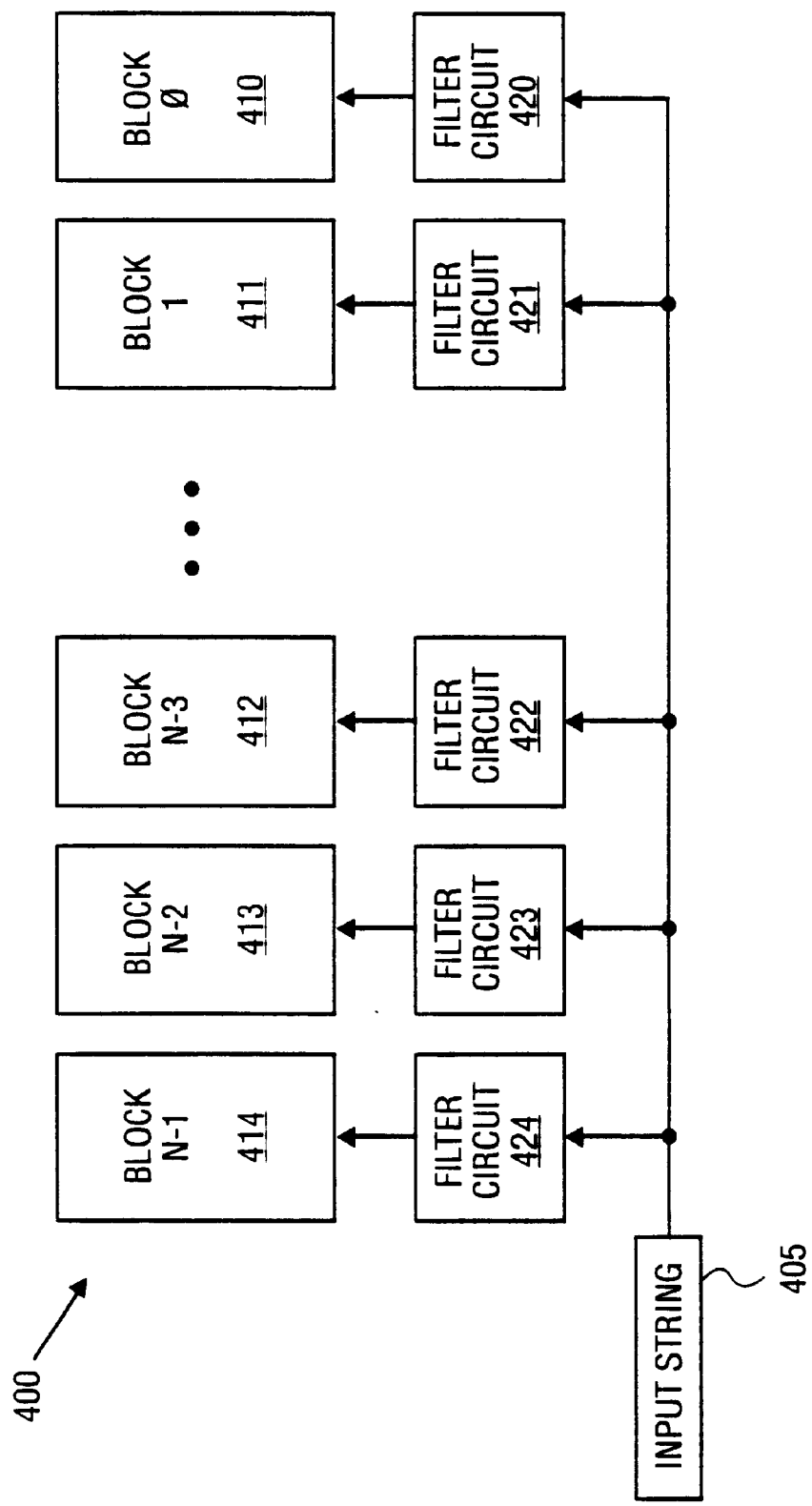
FIG. 4A illustrates one embodiment of a multiple block CAM device having input string filtering circuits.

FIG. 4A illustrates one embodiment of a multiple block CAM device having input string filter circuits. CAM device 400 may be CAM device 320 of FIG. 3. As discussed above in relation to CAM 320 of FIG. 3, a block may be an entire array or a portion of a larger array. In one embodiment, CAM device 400 includes multiple block memory arrays (N blocks) with each block storing a different lookup table or portions of one or more common lookup tables (e.g., block 0 and block 1 may store one lookup table and blocks N-3 to N-1 may store a different lookup table). Although five blocks 410–414 are shown for ease of illustration, CAM device 400 may have more or less than five blocks. Each of blocks 410–414 is coupled to a filter circuit 420–424, respectively. Each of filter circuits 420–424 is configured to receive a common input string 405 and filter, extract or remove from input string 405 one or more segments that will be used to perform a lookup. In an alternative embodiment, CAM device 400 may include multiple, single block CAM devices instead of a single, multiple block CAM device as shown in FIGS. 4A and 4B. Each filter circuit may also compact the extracted search information to form a contiguous bits that participate in a compare with data stored in the corresponding CAM block.

Each of the filter circuits 420–424 may have dedicated filter functions. Alternatively, each filter circuit may be programmable to dynamically select one or more segments or bits of input string 405.

Figure 4B:
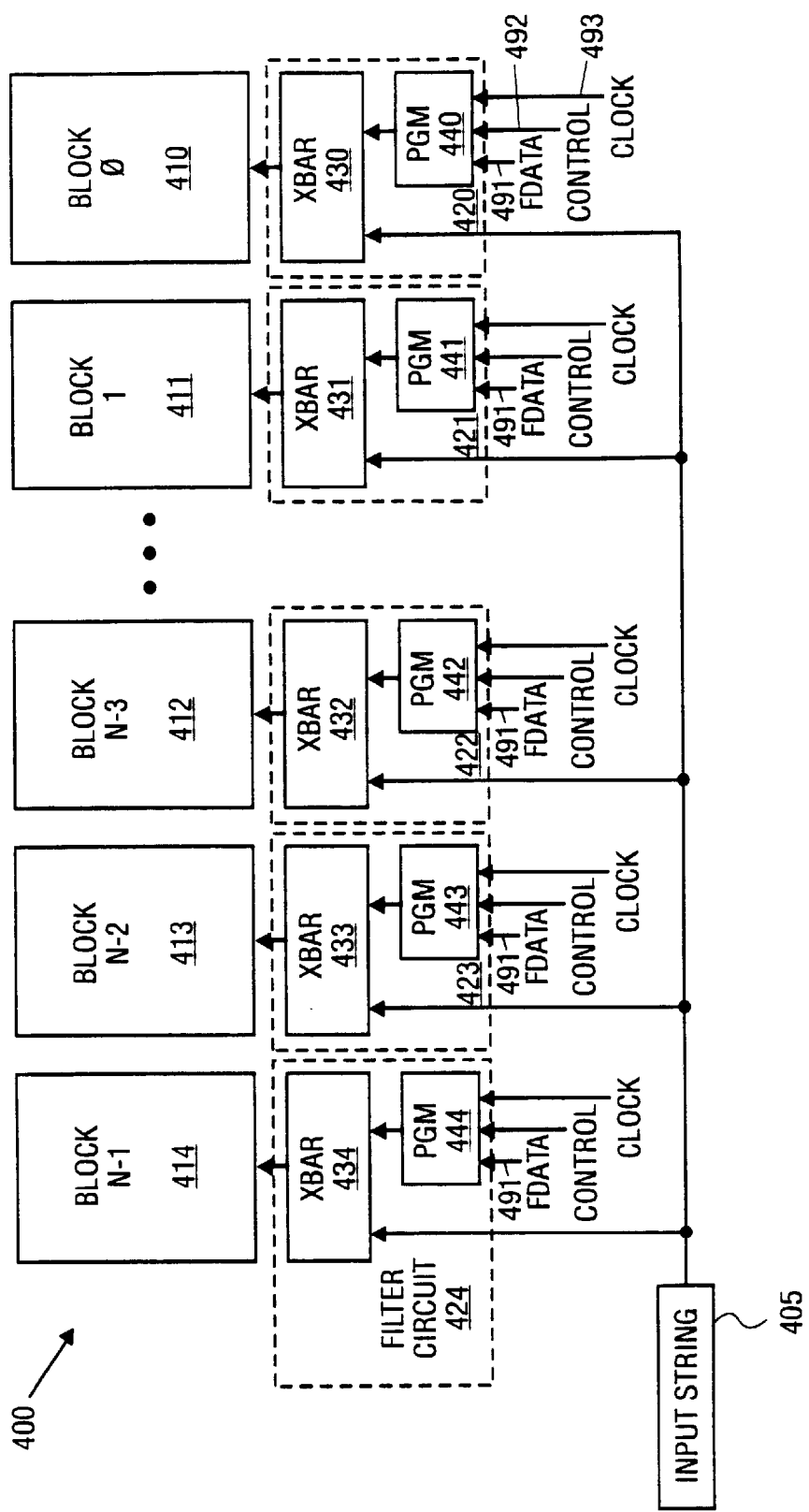
FIG. 4B illustrates one embodiment of filtering circuits in a multiple block CAM device.

In one embodiment, illustrated in FIG. 4B, each of filter circuits 420–424 includes a cross-bar switch (XBAR) and a programming circuit (PGM). For example, filter circuit 420 includes cross-bar switch 430 and programming circuit 440. Programming circuit 440 may be used to pre-program cross-bar switch 430 to filter out particular field segments of input string 405 and shift bit positions of the field segments to compact the filtered string segment into a compacted, filtered comparand string. It should be noted that one or more of filter circuits 420–424 need not contain a programming circuit. For example, one or more of the cross-bar switches may be configured for external device access and direct programming (e.g., by processor 310 of FIG. 3). Programming circuits in the CAM device 400 may be included as an added convenience to the user.

Programming circuit 440 is configured to receive filter data (FDATA), via data line(s) 491, that is used to directly or indirectly program the cross-bar switch 430 to generate a particular filtered comparand string from common input string 405. Programming circuit 440 may also be configured to receive one or more control signals via control line(s) 492 and one or more clock signal(s) via line 493 from a clock generator (not shown) to control the operation of the programming circuit, as discussed in detail below.

It should be noted that filter circuits 421–424 may operate in a manner similar to that discussed for filter circuit 420. Each of filter circuits 420424 may select a different segment, or combination of segments, of the common input string 405 where each block stores a different table. Alternatively, one or more filter circuits may select the same segment, or the same combination of segments, of the common input string 405 when, for example, corresponding CAM blocks store portions of the same lookup table. As such, each of cross-bar switches 430–434 may be pre-programmed by its corresponding programming circuit 440–444, respectively, to filter appropriate field segments of the input string. All resulting filtered comparand strings may then be concurrently compared with their respective lookup tables stored in the corresponding CAM block. For example, the filtered comparand string generated by filter circuit 420 is compared with the lookup table stored in block 410, while filtered comparand string generated by filter circuit 421 is compared with the lookup table stored in block 411.

In an alternative embodiment, the filtering of common input string 405 to generate the filtered comparand strings or search keys may be accomplished sequentially. The lookups in the blocks may also be performed concurrently or sequentially.

Figure 5A:
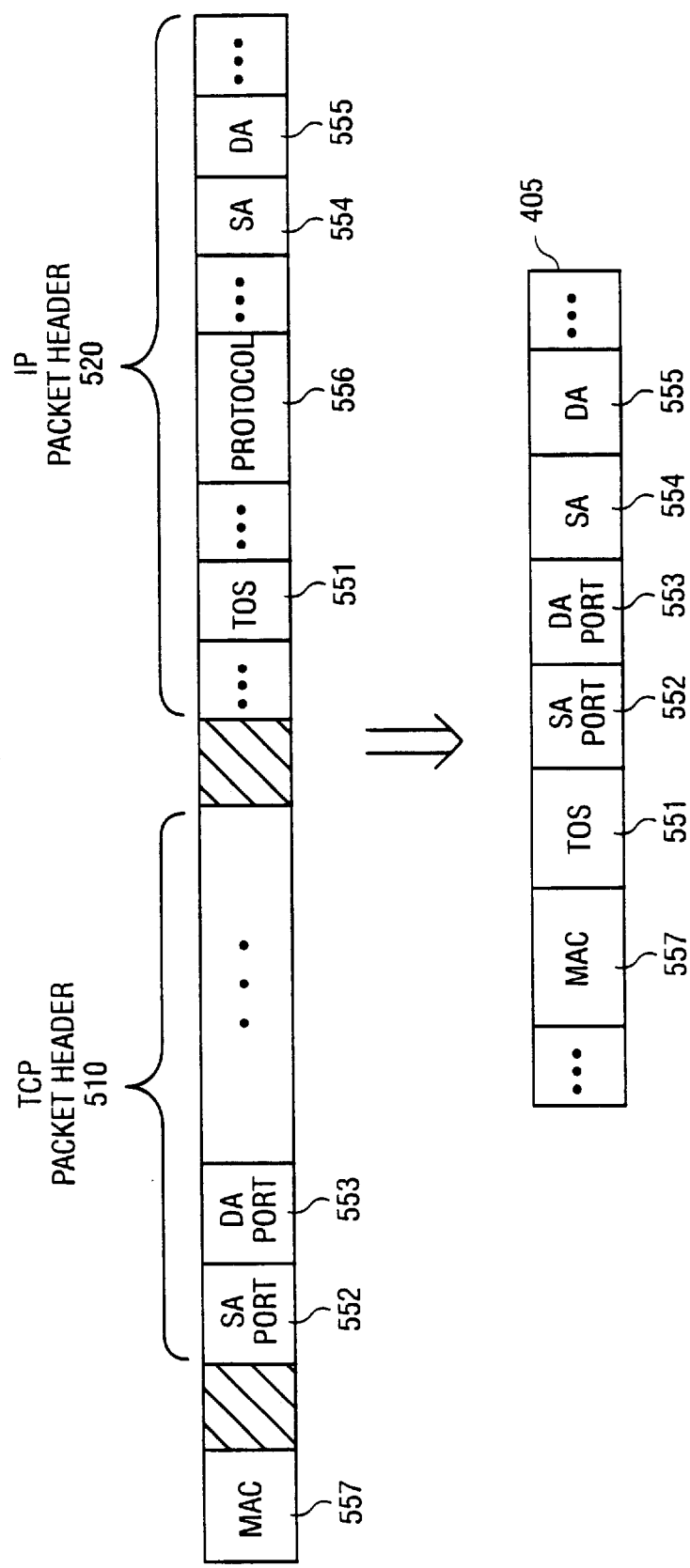
FIG. 5A illustrates one embodiment of an input string.

FIG. 5A illustrates one embodiment of an input string. In one embodiment, input string 405 may include field segments parsed or processed from one or more packet headers 510 and 520. When data processing systems (e.g., routers, clients, servers) exchange data over a network, the procedure involves the use of protocols by which these systems agree on how to communicate with each other. To reduce design complexity, networks may be organized as a series of layers. The number of layers and the function of each layer varies from network to network.

For example, where a transmission control protocol (TCP)/Internet protocol (IP) is used, it is organized into multiple layers including a network access layer and an Internet layer. The network access layer uses a TCP to enable the exchange of data between an end system and a network. An Internet layer uses an IP to enable data to transverse multiple interconnected networks. Each of these protocols use packet headers containing routing information, as discussed above. For example, TCP packet header 510 includes a source address (SA) port segment 552 and a destination address (DA) port segment 553, and IP packet header 520 includes a SA segment 554, a DA segment 555, a type of service (ToS) segment 551, and a protocol type segment 556.

In one embodiment, for example, processor 310 of FIG. 3 may be used to parse certain segments from packet headers 510 and 520 to generate input string 405 and transmit the input string to CAM device 320. For example, input string 405 may include MAC segment 557, TOS segment 551, SA port segment 551, DA port segment 552, SA segment 554, and DA segment 555. Alternatively, input string 405 may include more or less than the segments illustrated. Each of filter circuits (illustrated in FIGS. 4A and 4B) may then filter out the bit values of different field segments of input string 405 to generate different filtered comparand strings to concurrently perform different lookups in the CAM blocks. In an alternative embodiment, processor 310 may transmit as-received unparsed header segments to CAM device 320.

Figure 5B:
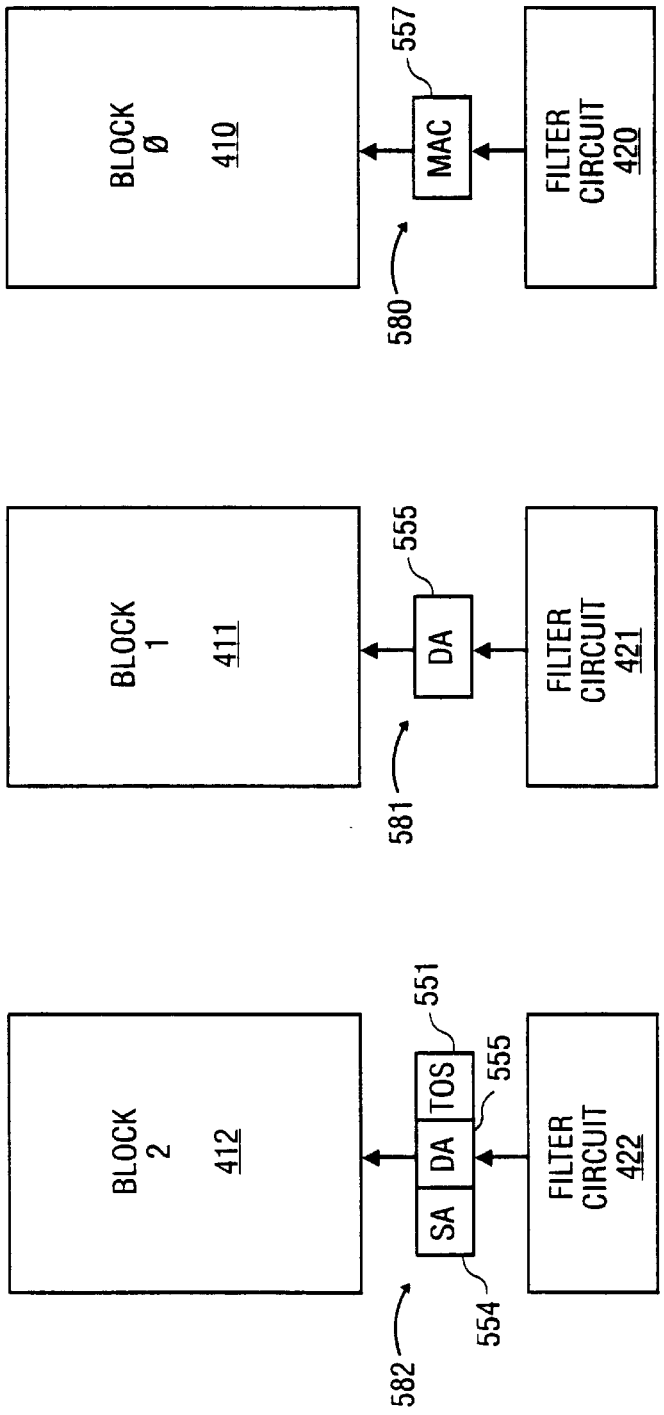
FIG. 5B is a conceptual illustration of the operation of CAM device using particular packet header segments from the input string of FIG. 5A.

FIG. 5B is a conceptual illustration of the operation of CAM device 400 using the packet header segments for input string 405 that are illustrated in FIG. 5A. For example, CAM device 400 may include three CAM blocks 410, 411, and 412. Each block 410, 411, and 412 is coupled to a corresponding filter circuit 420, 421, and 422, respectively. Each of filter circuits 420–422 is configured to receive input string 405 and process the received input string 405.

In one embodiment, filter circuits 420–422 may be preprogrammed to filter particular field segments of the input string 405 in order to perform concurrent lookups on the various tables stored in blocks 410–412. For example: filter circuit 420 may be preprogrammed to filter MAC segment 557 resulting in filtered comparand string 580; filter circuit 421 may be preprogrammed to filter DA segment 555 resulting in filtered comparand string 581; and filter circuit 422 may be preprogrammed to filter SA segment 554, DA field segment 555 and TOS segment 551 resulting in filtered comparand string 582. By filtering different field segments from a common input string 405, in parallel, each of filtered comparand strings 580–581 may then be used to concurrently perform the various lookups. For example: filtered comparand string 580 may be used to perform a MAC lookup in CAM block 410; filtered comparand string 581 may be used to perform a Next Hop (e.g., LPM) lookup in CAM block 411; and filtered comparand string 582 may be used to perform a Classification lookup in CAM block 412. As such, if each lookup individually requires X clock cycles to perform, only a total of X clock cycles may be required to perform all three lookups because the lookups are performed concurrently. In this manner, packet throughput in a router may be significantly increased over routers utilizing prior CAM architectures.

Figure 6:
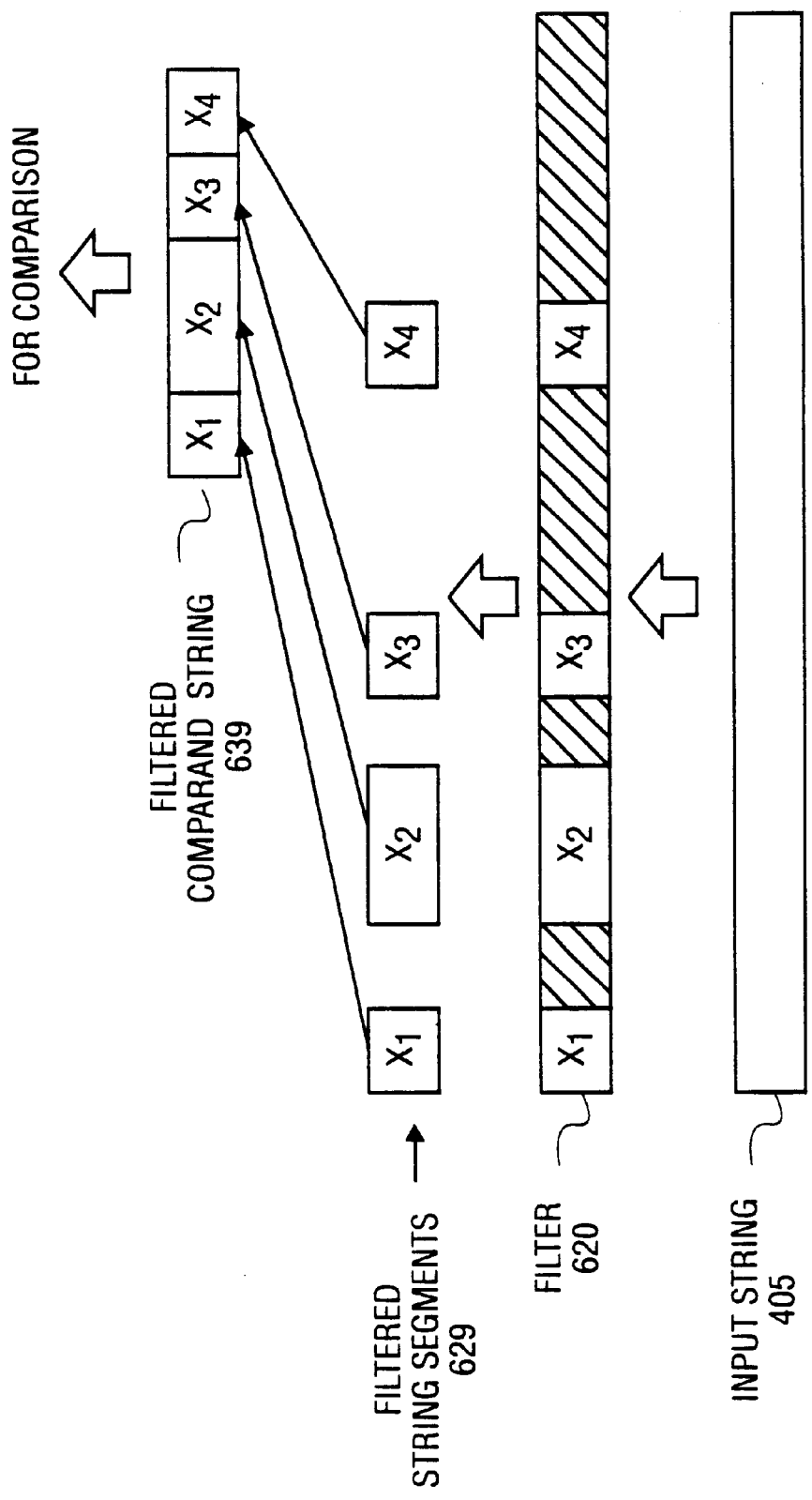
FIG. 6 is a conceptual illustration of one embodiment of the filtering and compacting of an input string.

FIG. 6 is a conceptual illustration of one embodiment of the filtering and compacting of an input string. As previously discussed, input string 405 may be part, or all, of a header of a packet or may include field segments from other parts of a packet or other processed information. Input string 405 is passed through a filter 620 that masks out, or blocks, undesired field segments of input string 405. The output of filter 620 is one or more filtered string segments 629. For example, four string segments $X_1$, $X_2$, $X_3$, and $X_4$ may be filtered through filter 620. The strings segments $X_1$, $X_2$, $X_3$, and $X_4$ may correspond to, for example, DA, SA, Type of Service (ToS), and protocol type. The filtering of input string 405 may be performed by one or more of filter circuits 420–424, with each of filter circuits 420–424 programmed to filter different field segments of input string 405 or one or more of the same field segments. The filtering of input string 405 may be performed on a bit basis. Alternatively, the filtering of input string 405 may be performed based on other sizes, for example, a byte size. Moreover, each of filter circuits 420–424 may be reprogrammed to filter different field segments of input string 405 from a prior programmed state.

As shown in FIG. 6, the filtered string segments ($X_1$, $X_2$, $X_3$, and $X_4$) 629 may not be adjacent to each other. Such non-adjacent filtered string segments may be shifted to generate a compacted filtered string 639. Where the filtering is performed, for example, on a bit basis, a filter circuit (e.g., filter circuit 420) moves the bits of the filtered string segments 629 to generate filtered comparand string 639. In one embodiment, for example, all of the bits of filtered string segment 629 are shifted to the lowest positions. Alternatively, the bits of filtered string segments 629 may be shifted in other manners, for example, to the highest positions.

Figure 7:
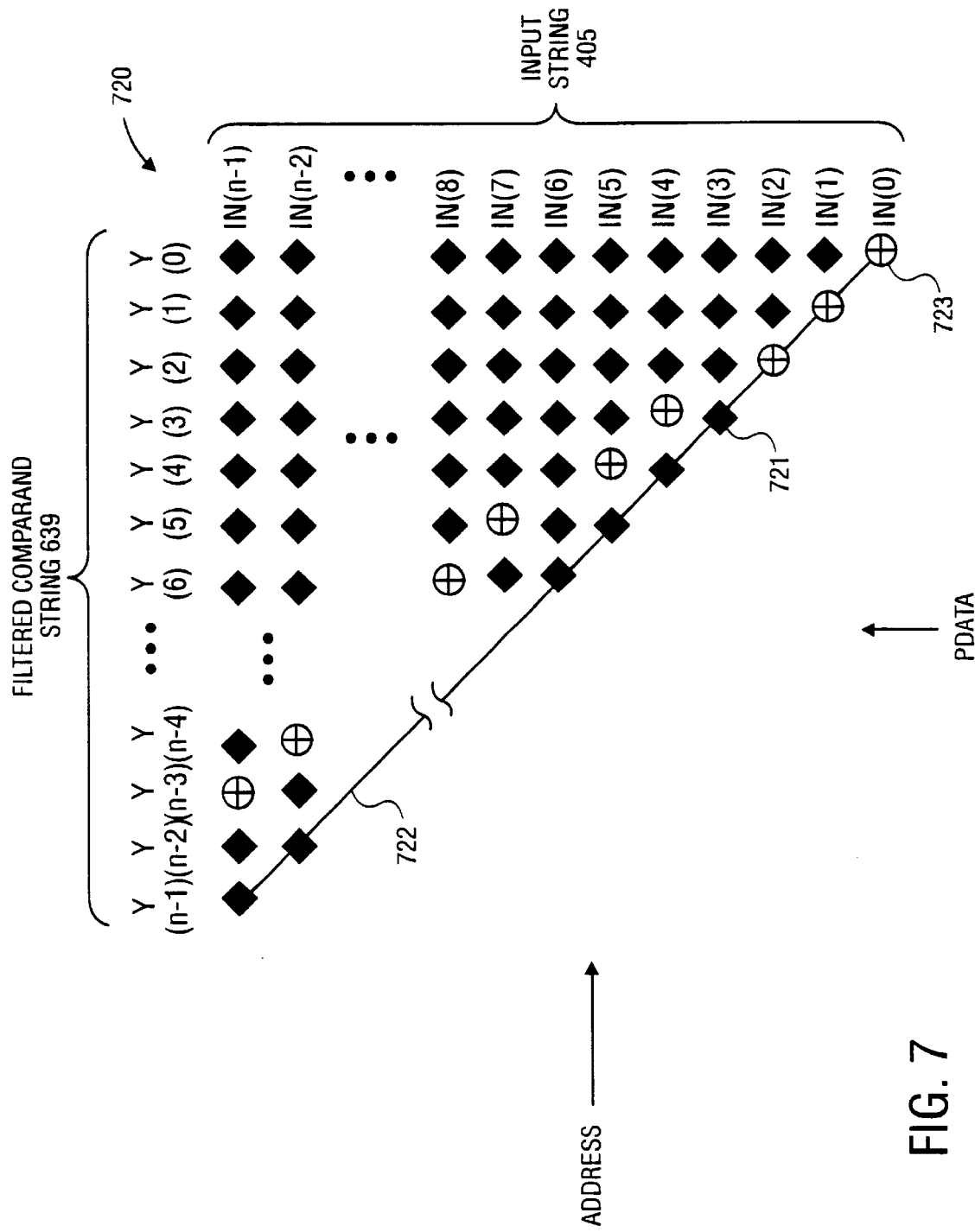
FIG. 7 is a conceptual illustration of one embodiment of bit manipulation for the filtering and compacting of an input string.

FIG. 7 is a conceptual illustration of one embodiment of bit manipulation for the filtering and compacting of an input string using a cross-bar switch 720 (e.g., cross-bar switch 430). The cross-bar switch 720 includes an n by n matrix of intersections, where n is the bit width of input string 405 and also the bith width of the output string. Each of the diamonds (e.g., diamond 721) represents an intersection, and possible connection, for an input bit IN(0)-IN(n−1) and an output bit Y(0)-Y(n−1) of the filtered comparand string. One or more intersections is selected by an address, and cross-bar switch 720 is programmed by program data (PDATA) to select and translate or compact predetermined bits from input string 405 to output bit positions of the compacted filtered comparand string. The address and/or FDATA may be generated by a program circuit (e.g., program circuit 440 of FIG. 4B), or externally (e.g., by processor 310 of FIG. 3).

Line 722 across the diagonal of filter circuit represents a one-to-one connection correlation between the bit positions of an input string 405 and an output filtered comparand string 639. The selected or programmed bits, pictorially the "+" encapsulated in a circle, (e.g., connection 723 of FIG. 7) represent a programmed bit for making a connection between an input bit position and an output bit position. Each connection is established by programming one or more circuit elements at the intersections. Programming of an intersection may be accomplished using various means including writing the state of a memory cell, blowing a fuse or other connection, leaving a connection intact, and the like. For example, when a memory element is used to establish connections at an intersection, a connection may be established by writing a first logic state (e.g., a logic "1") to the memory element, and no connection may be established by writing a second logic state (e.g., a logic "0") to the memory element.

Cross-bar switch 720 is programmed to avoid bit gaps in the resulting filtered comparand string 639 that is output by filter circuit 720. In the illustrated example, all of the selected bits of input string 405 are shifted to the lowest bit positions. The resulting filtered comparand string 639 may, thus, have significantly fewer bit positions than the input string 405. For example, the input string 405 may be 288 bits wide (n=288), whereas the filtered comparand string 639 may be only 72 or 144 bits wide. The number of intersections in the cross-bar switch may be reduced to match the number of output bits. Advantageously, the lookup entries in each of the CAM blocks 410–414 may be significantly smaller than the size of input string 405. Thus, a narrower CAM array (i.e., having fewer bits per row than the total length of the common input string) may be used. The compacted filtered string may also have desirable power savings as the unused columns of a CAM array may be globally masked by a global mask circuit (not shown) and, thus, draw or dissipate minimal or substantially low power during a search operation. Global masks are known in the art; accordingly, a detailed discussion is not provided herein.

The illustration of FIG. 7 describes a programmed cross-bar switch that compacts or translates input data from higher bit positions to lower bit positions in the output data string. Alternative filters may compact or translate input data from lower bit positions to higher bit positions in the output string. Additionally, the filtered string need not be compacted, and the filtered string with gaps, if any, may be provided to a CAM block or table for look-up. The unused bits in the search key provided to the CAM block may be globally masked by a global mask register.

It should be noted that the size of the filtered comparand string generated by cross-bar switch 720 may be smaller than input string 405 even if the selected bits on the input string 405 are contiguous. For example, if the bits of input string 405 to be selected correspond to rows 0 to row 2, the output bits would not need to be shifted, because the selected rows are contiguous. As such, even when the desired bits of input string 405 are contiguous, the size of the resulting filtered comparand string 639 may also be smaller than the size of input string 405 as a whole.

Figure 8:
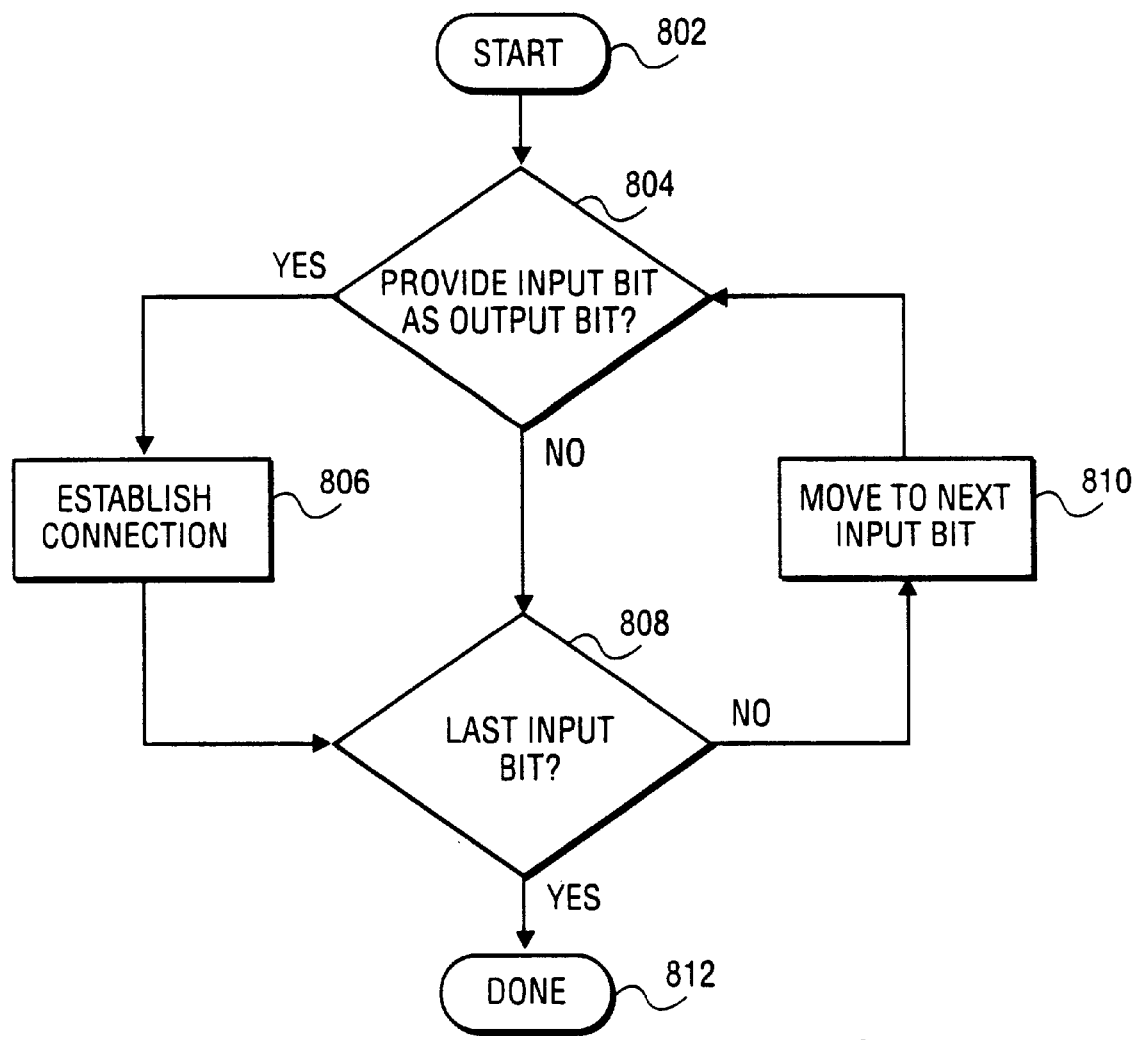
FIG. 8 illustrates one method of programming a filter circuit such that it can filter and compact an input string.

FIG. 8 illustrates one method of programming a filter circuit such that it can filter and compact an input string. The method may be performed, for example, by programming circuit 440 of FIG. 4B or by processor 310 of FIG. 3. The method may commence in response to an explicit program instruction or control signal provided to the CAM device, upon reset, or in response to other stimulus. In one embodiment, gaps in resulting output string 639 may be avoided by continually sequencing through input bits and determining whether the input bit should be provided as a particular output bit.

Programming starts at step 802. A determination is made at step 804 whether a particular input bit should be provided to a particular output bit position (e.g., as determined by FDATA provided to program circuit 440 of FIG. 4B). If so, an appropriate connection is established or programmed in the cross-bar switch at step 806. If this is not the last input bit, step 808, the method moves to the next input bits, step 810, and repeats step 804. When all of the input bits have been processed, the process is complete, step 812.

Figure 9:
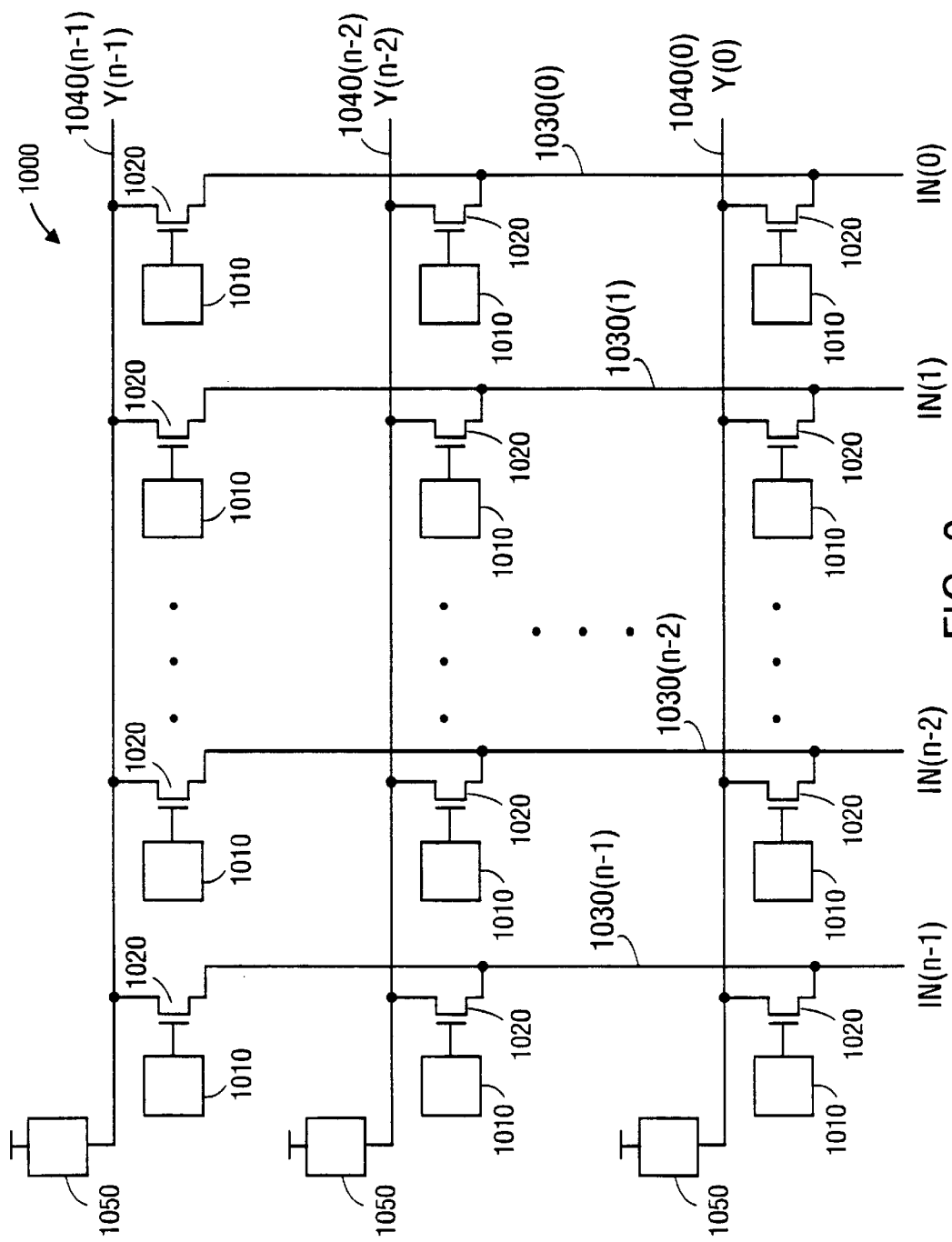
FIG. 9 illustrates one embodiment of cross-bar switch.

Any type of cross bar switch may be used for cross-bar switch 430 of FIG. 4. FIG. 9 illustrates cross-bar switch 1000 that is one embodiment of cross-bar switch 430. Cross-bar switch 1000 includes an array of rows and columns of memory storage elements 1010 coupled to the gates of transistors 1020. Each memory storage element/transistor pair is positioned at the intersection of a row and column, and is used to establish (or not establish) a connection between input signals IN(0)-IN(n−1) and output signals Y(0)-Y(n−1). Input signals IN represent the input string data (e.g., input string 405 of FIG. 4A), and output signals Y represent filtered output string provided to a CAM block or table.

Each memory storage cell 1010 stores a state that indicates whether a connection is established at a particular row and column intersection in switch 1000. The memory storage cells may be any type of memory including, random access memory (RAM) cells (both static and dynamic), read only (ROM) cells, and other volatile or non-volatile memory storage cells. The memory storage cells may be programmed or written to using any write circuitry appropriate for the memory storage cell type. If the memory storage cell stores a logic "1" state, the associated transistor 1020 is enabled to let an input signal IN on one of the signal lines 1030(0)-1030(n−1) to pass to one of the outputs Y on one of the signal lines 1040(0)-1040(n−1). The output signal lines 1040 may also be pre-charged to predetermined or default states by precharge circuits 1050. Precharge circuits 1050 may be any well-known circuits.

Cross-bar switch 1000 is a full cross-bar switch that enables any input to be connected to any output Y. For alternative embodiments, only a portion of the cross-bar switch 1000 may be needed such as when an input string is compacted. For example, when compacting the input string from higher bit positions to lower bit positions in the output string, the corresponding circuitry of the cross-bar switch for translating lower bit positions to higher bits positions may be removed from a full cross-bar switch. Similarly, when compacting the input string from lower bit positions to higher significant bit positions in the output string, the corresponding circuitry of the cross-bar switch for translating higher bit positions to lower significant bits positions may be removed from a full cross-bar switch. Exemplary embodiments of modified cross-bar switches are discussed below.

Figure 10:
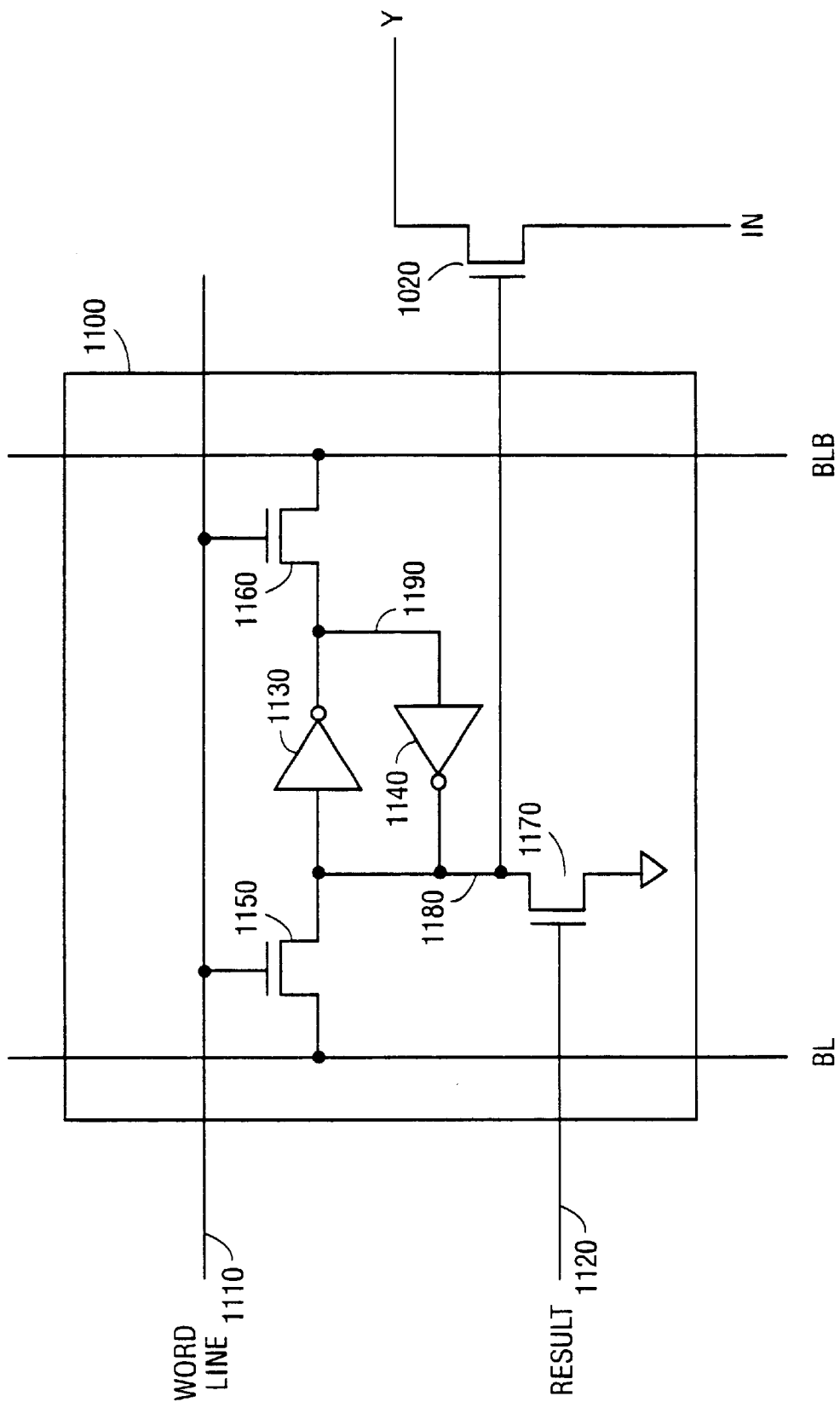
FIG. 10 illustrates one embodiment of a memory storage element of the cross-bar switch of FIG. 9.

FIG. 10 illustrates memory storage cell 1100 that is one embodiment of memory storage cell 1010. Cell 1100 includes cross-coupled inverters 1130 and 1140 that form a bi-stable latch for storing data at nodes 1180 and 1190. Pass gates 1150 and 1160 allow program data (and read data) to be communicated with the storage nodes when the word line signal on signal line 1110 is active. Node 1180 is coupled to the gate of transistor 1020. Reset transistor 1170 may also be included to pull node 1180 to a predetermined state of logic "0" when the reset signal Reset on signal line 1120 is activated. Reset transistor 1170 has its gate coupled to signal line 1120, its drain coupled to node 1180, and its source coupled to ground.

Figure 11:
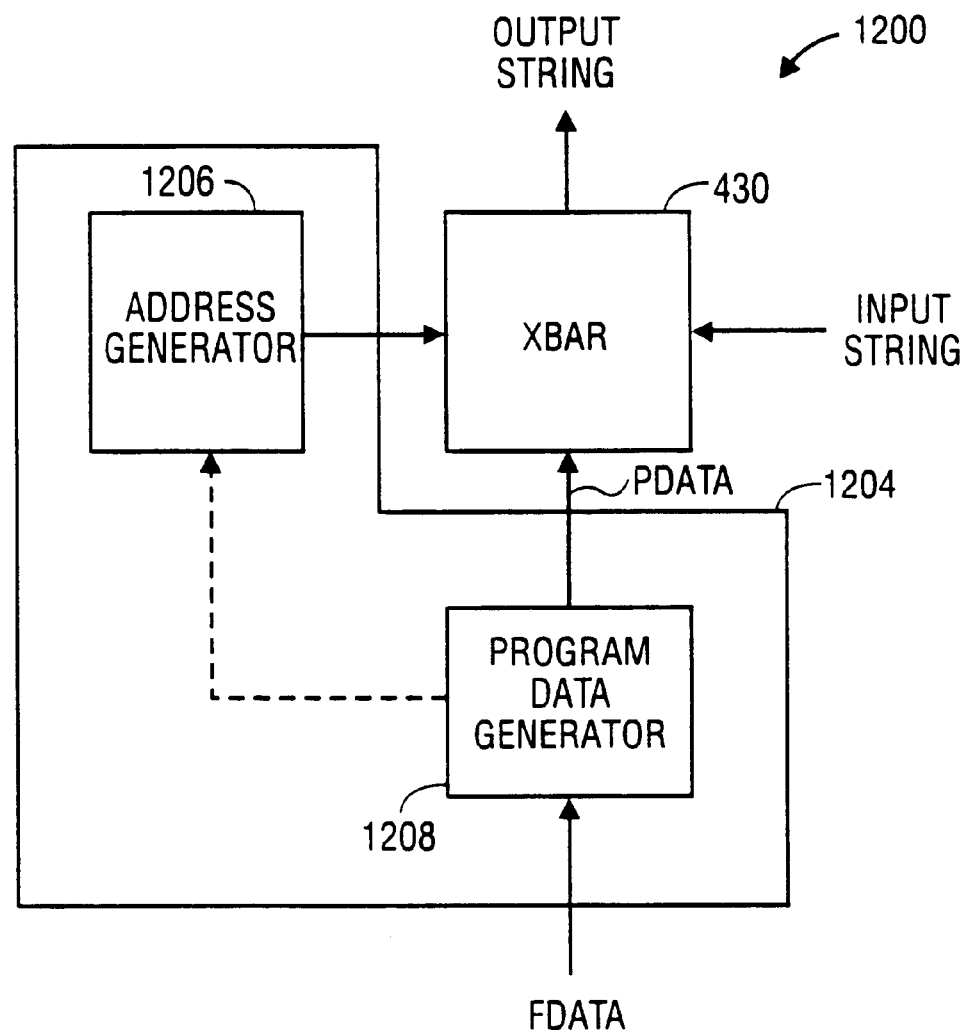
FIG. 11 illustrates one embodiment of a filter circuit.

FIG. 11 illustrates filter circuit 1200 that is one embodiment of one of the filter circuits 420–424 of FIG. 4A. In this embodiment, filter circuit 1200 includes a cross-bar matrix switch 430 and a programming circuit 1204. In one embodiment, a full cross-bar switch (e.g., cross-bar switch 1000 of FIG. 9) may be used for cross-bar switch 430. In an alternative embodiment, a full crossbar switch may be modified to provide only required connection capability, thereby reducing the size of the cross-bar switch.

In this embodiment, programming circuit 1240 includes program data generator 1208 and address generator 1206. Program data generator 1208 generates programming data PDATA to program one or more of the intersections of cross-bar switch. PDATA is generated in response to filter data FDATA that indicates which input bits are to be included in the output string, and whether and how the inputs bits are to be compacted or translated in the output string. FDATA may be provided, for example, by processor 310 of FIG. 3. Address generator 1206 is coupled to cross-bar switch 430. In an alternative embodiment, address generator 1206 may also be coupled to program data generator 1208. Address generator 1206 operates to access one or more intersections of cross-bar switch 430 for programming. Address generator 1206 may include, for example, one or more row and/or column decoders to select one or more rows or columns of intersections in the cross-bar switch for programming, or to select a single intersection or other groups of intersections for programming.

Figure 12:
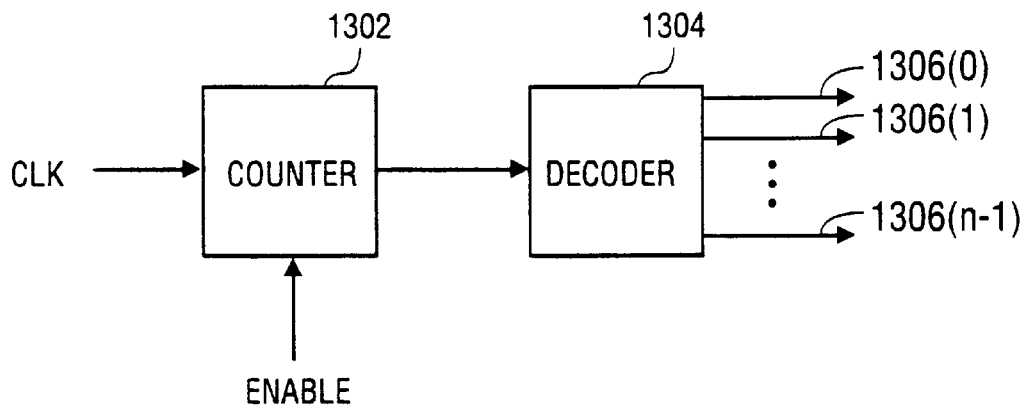
FIG. 12 illustrates one embodiment of the address generator of FIG. 11.
Figure 13:
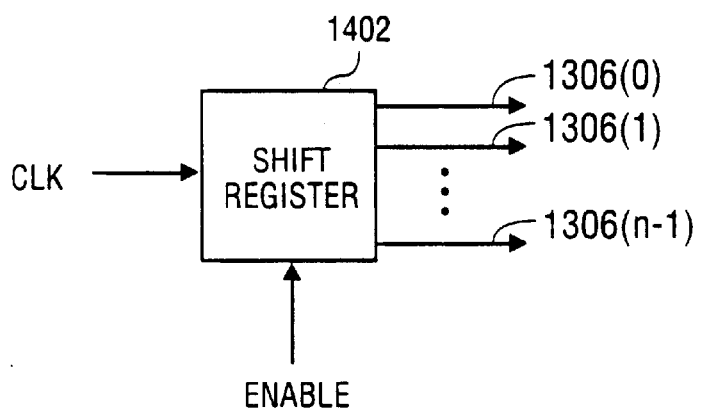
FIG. 13 illustrates another embodiment of the address generator of FIG. 11.

In one embodiment, address generator 1206 includes a decoder 1304 controlled by an address counter 1302 as illustrated in FIG. 12. Address counter 1302 is configured to sequence decoder 1304 through the rows or columns of cross-bar switch 430 by activating the signals on signal lines 1306(0)-1306(n−1) coupled to the cross-bar switch 430. Counter 1302 increments or decrements its count to select a new row or column in response to the clock signal CLK and an enable signal ENABLE that is activated for programming. The ENABLE signal may be controlled by program data generator 1208 (e.g., in response to FDATA), or may controlled externally (e.g., by processor 310 of FIG. 3). Alternatively, address generator 1206 may have other components, for example, a shift register 1402 to sequence through the rows and/or columns of cross-bar switch 430 as shown in FIG. 13. Address generators, address decoders, registers, and counters are known in the art; accordingly, a detailed discussion is not provided.

Figure 14:
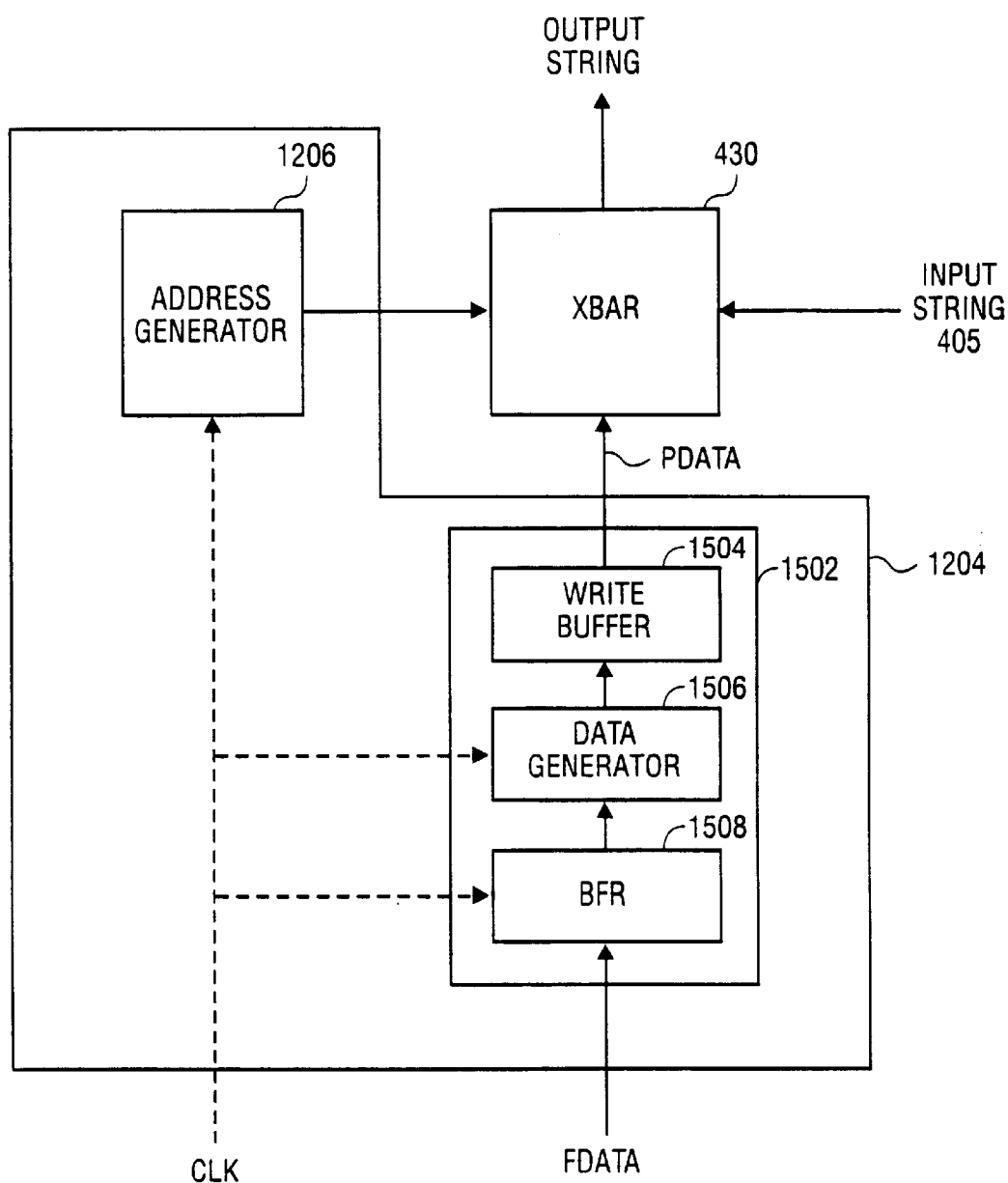
FIG. 14 illustrates another embodiment of a filter circuit.

FIG. 14 illustrates program data generator 1502 that is one embodiment of program data generator 1208 of FIG. 11. Program data generator 1502 includes write buffer circuit 1504, data generator 1506, and block filter register (BFR) 1508. Data generator 1506, BFR 1508 and address generator 1206 may optionally receive one or more clock signals CLK as shown as a dashed line in FIG. 14.

Block filter register 1508 stores the particular filter data FDATA that is used to filter input string 405 to obtain a desired filtered comparand string. Block filter register 1508 may be programmed (e.g., by processor 310 of FIG. 3) with a particular "1" and "0" bit pattern based on the desired filtering of input string 405. As such, each of the block filter registers within filter circuits 420–424 may store a different bit pattern in order to filter different bits from the common input string 405 that is applied to all filter circuits 420–424. Alternatively, a block filter register may store the same bit pattern as other block filter registers. In another embodiment, multiple block filter registers may be used in a single program generator 1502 and selectable (e.g., by processor 310 of FIG. 3, or by other elements) to provide the appropriate FDATA.

Block filter register 1508 is coupled to data generator 1506. Data generator 1506 generates the PDATA bit pattern that is loaded into write buffer circuit 1504 to selectively program intersections within cross-bar switch 430. Write buffer circuit 1504 operates to buffer the data programmed to cross-bar switch 430. In one embodiment, write buffer circuit 1504 may be part of data generator 1506. Write buffer circuits are known in the art; accordingly, a detailed discussion is not provided.

For one embodiment, there are as many bits of FDATA loaded into BFR 1508 as there are bits in the input data string. A particular bit of FDATA indicates whether the corresponding bit position in the input string will be present in the output string. In this manner, the FDATA in BFR 1508 operates as a mask to filter certain input bits from being provided on the output sting to the CAM block. The masking provided by the FDATA allows data generator 1506 to generate the appropriate PDATA for cross-bar switch 430 such that switch 430 will filter and compact the input string appropriately.

In one exemplary illustration of the operation of program circuit 1204, address generator 1206 is configured to initially select a first row of crossbar switch 430. Data generator 1506 programs an interconnection for the selected row and a particular column if the corresponding FDATA bit stored in block filter register 1508 has a "1" stored in the bit position corresponding to that row/column location. If the FDATA bit stored in block filter register 1508 stores a "0" in the bit position corresponding to that row/column location, then data generator 1506 programs a "0" into the row and columns interconnects such that no connections are established for that input row. Address generator 1206 then sequences through the rest of the rows and the additional FDATA bits in the block filter register further determine whether connections are established. For one embodiment, address generator 1206 sequences through the rest of the rows and conditionally sequences through the columns as determined by the FDATA. For another embodiment, address generator 1206 conditionally sequences to a new row and continually sequences through the columns as determined by FDATA.

Figure 15:
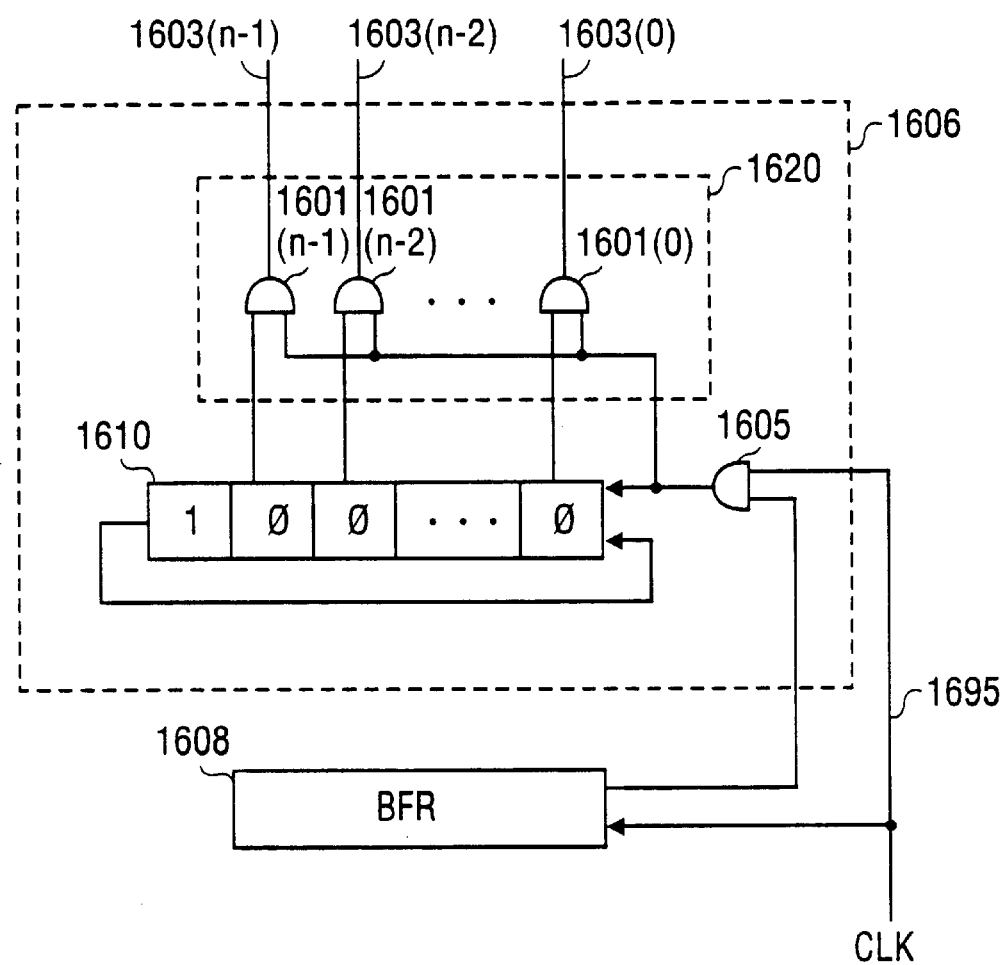
FIG. 15 illustrates one embodiment of a data generator coupled to a block filter register.

FIG. 15 illustrates data generator 1606 and BFR 1608 that are embodiments of data generator 1506 and BFR 1508, respectively. Data generator 1606 includes shift register 1610, logic circuit 1620, and logic gate 1605. Shift register 1610 includes n+1 bits of data wherein the first n bits are initially all logic "0" and the n+1 bit is set to a logic "1". Shift register 1610 is a looped shift register such that the "1" preloaded in the n+1 bit position is shifted through the other bit positions of shift register 1610 based on the output of AND gate 1605. As such, at any given time, only one bit position in shift register 1610 contains a logic "1" while the other bit positions contain a logic "0."

BFR 1608 is also a shift register and stores n bits of FDATA. Each bit of FDATA stored in BFR 1608 is clocked out to one input of AND gate 1605 by CLK on signal line 1695. AND gate 1605 also receives CLK and, in response to a logic "1" on both FDATA input and CLK, enables shift register 1610 to shift its contents left by one bit. Thus, the FDATA stored in BFR 1608 determines whether shift register 1610 shifts its contents. Note that, shift register 1610 and BFR 1608 may be configured to receive different clock signals. Also note that the output of AND gate 1605 may also be latched or registered prior to signalling to shift register 1610 and logic circuit 1620.

Each bit in shift register 1610 is also coupled to one input of AND gates 1601(0)-1601(n−1) of logic circuit 1620. The other input of the AND gates 1601(0)-1601(n−1) are coupled to receive the output of AND gate 1605. When CLK is low (i.e., a logic "0" state), the AND gates 1601 output a logic "0". When CLK is high (i.e., a logic "1" state), the AND gates 1601 output the bit contents received from shift register 1610. With such a configuration, logic circuit 1620 either outputs all "0"s or the bit contents of shift register 1610. The signals output from AND gates 1601(0)-1601(n−1) are output to signal lines 1603(0)-1603(n−1), respectively, and are coupled to write buffer circuit 1504 of FIG. 14. The write buffer circuit 1504, in turn, provides this data as PDATA to the crossbar switch to establish row and column connections therein.

As noted above, logic circuit 1620 either outputs all logic "0"s or the contents of shift register 1610 as the PDATA to program a connection in cross-bar switch 430. When a row of cross-bar switch 430 is selected by address generator 1206, the row is either programmed with all logic "0"s such that no input bit to output bit location is established, or a single bit for the row is programmed to establish a connection. Address generator 1206 then sequences to the next row. The PDATA output by logic circuit 1620 is then updated as indicated by the FDATA in BFR 1608. If the next FDATA bit is a logic "0" state, no connection is made for the next row; however, if the next FDATA bit is a logic "1" state, a connection is programmed. In this manner, data generator 1606 and BFR 1608 are able to program cross-bar switch 430 to filter the input string and further compact the string. A specific example is shown in FIG. 16.

Figure 16:
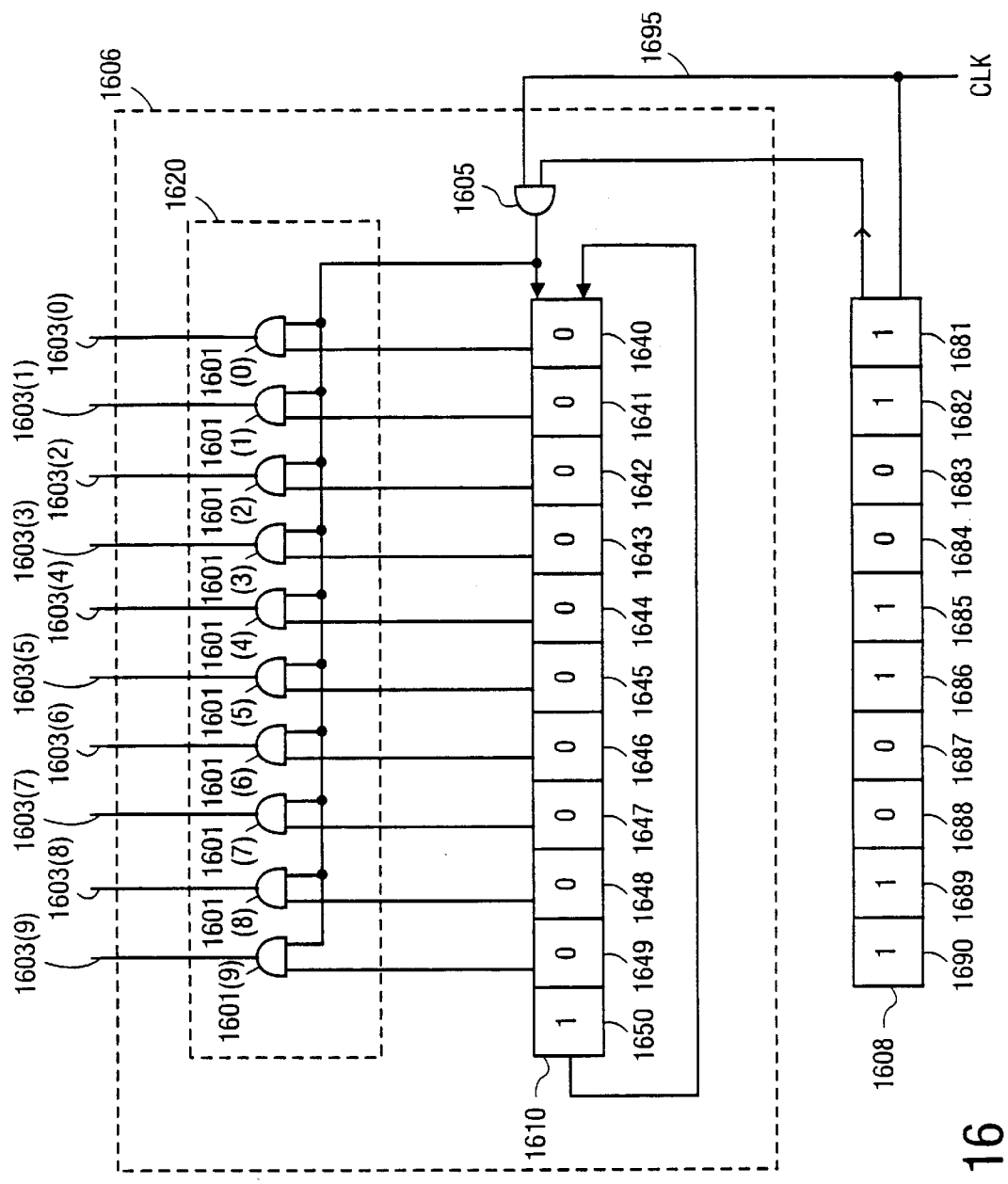
FIG. 16 illustrates an example of using the embodiment of FIG. 15.

In FIG. 16, shift register 1610 has 11 bit positions (n=10) and BFR 1608 has ten bit positions. BFR 1608 is illustrated with an exemplary bit pattern that may be used to establish certain connections in cross-bar switch 430 to filter and compact bits of input string 405. In this example, BFR 1608 stores FDATA having a "1" in bit positions 1681, 1682, 1685, 1686, 1689 and 1690. In order to mask out bits from input string 405, a "0" is stored in bits positions 1683, 1684, 1687, and 1688.

Initially, address generator 1206 of FIG. 14 selects a row (or column) of intersections in cross-bar switch 430 to determine whether the first input bit position IN(0) will be coupled to the corresponding first output bit position Y(0). In the first clock cycle of CLK, the "1" from bit position 1681 from BFR 1608 is provided to AND gate 1605. Since bit position 1681 has a "1", on the next clock cycle the "1" in bit position 1650 is shifted into bit position 1640 of shift register 1610. Subsequently, AND gates 1601(9)-1601(0) output 0000000001, respectively, as PDATA to the cross-bar switch 430 (via write buffer 1504) to establish a connection between IN(0) and Y(0) at the intersection of column 0 and row 0 of the switch matrix, as illustrated by the "+" in the row 0 and column 0 intersection of FIG. 17. Since AND gates 1601(1)-1601(9) output "0"s to other possible interconnections of row zero and other columns, no connections are established for those intersections.

Subsequently, address generator 1206 selects a second row (row 1) in cross-bar switch 430 to determine whether the second input bit position IN(1) will be coupled to either the first or second output bit positions Y(1) and Y(0), respectively. On a subsequent clock cycle of CLK, another shift and program operation is performed by shift register 1610 and logic circuit 1620, because BFR 1608 bit position 1682 stores a "1." A "1" is provided to AND gate 1605 and the "1" in bit position 1640 is shifted into bit position 1641 of shift register 1610 and a "0" is shifted into bit position 1640. AND gates 1601(9)-1601(0) output 0000000010, respectively, as PDATA to the cross-bar switch 430 (via write buffer 1504) to establish a connection between IN(1) and Y(1) at the intersection of column 1 and row 1 of the switch matrix, as illustrated by the "+" in the row 1 and column 1 intersection of FIG. 17. Since AND gates 1601(0) and 1601(2)-1601(9) output "0"s to other possible interconnections of row one and other columns, no connections are established for those intersections.

Figure 17:
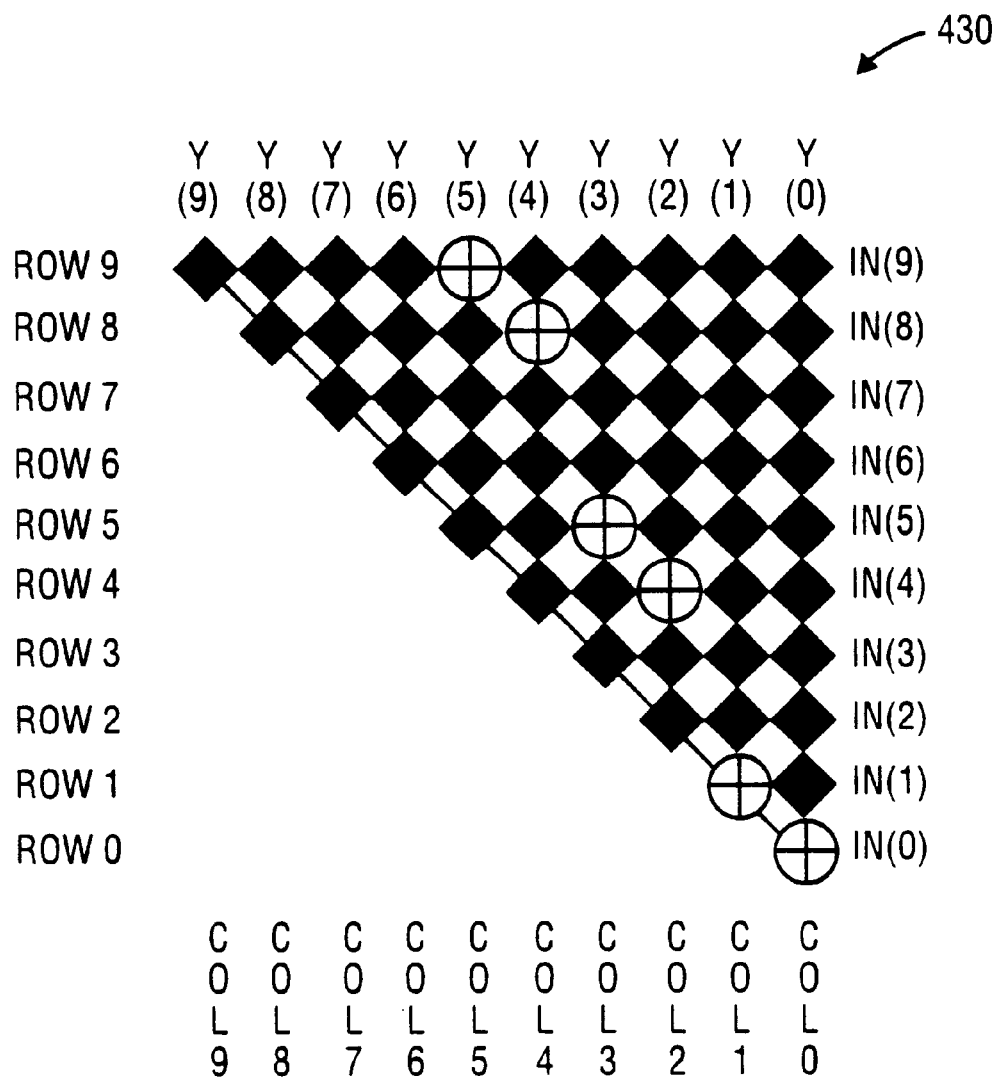
FIG. 17 illustrates ten matrix connections for a cross-bar switch based on the exemplary bit pattern in a block filter register.

Address generator 1206 then selects a third row (row 2) in cross-bar switch 430 to determine whether the third input bit position IN(2) will be coupled to either the first, second or third output bit positions Y(0), Y(1) or Y(2), respectively. On the next clock cycle, shift register 1610 does not shift due to the "0" stored in bit position 1683 of BFR 1608. As such, no connection is established for row 2 with a column or output of the switch 430. That is, IN(2) is not coupled to a corresponding output bit position in the filter output string and is effectively masked out as shown in FIG. 17.

Address generator 1206 then selects a fourth row (row 3) in crossbar switch 430 to determine whether the fourth input bit position IN(3) will be coupled to either the first, second, third or fourth output bit positions Y(0), Y(1), Y(2), and Y(3), respectively. On the next clock cycle, shift register 1610 does not shift due to the "0" stored in bit position 1684 of BFR 1608. As such, no connection is established for row 3 with a column or output of the switch 430. That is, input bit 4 is not coupled to a corresponding output bit position in the filter output string and is effectively masked out as shown in FIG. 17.

Address generator 1206 then selects a fifth row (row 4) in cross-bar switch 430 to determine whether the fifth input bit position IN(4) will be coupled to either the first, second, third, fourth or fifth output bit positions Y(0), Y(1), Y(2), Y(3), and Y(4), respectively. On a subsequent clock cycle, because a "1" is stored in bit position 1685, the "1" in bit position 1641 is shifted into bit position 1642 of shift register 1610. AND gates 1601(9)-1601(0) output 0000000100, respectively, as PDATA to the cross-bar switch 430 (via write buffer 1504) to establish a connection between at the intersection of column 2 and row 4 of the switch matrix, as illustrated by the "+" in the row 4 and column 2 intersection of FIG. 17. Thus, a connection between the IN(4) and Y(2) is established. Since AND gates 1601(0)-1601(1) and 1601(3)-1601(9) output "0"s to other possible interconnections of row one and other columns, no connections are established for those intersections. The completed filtering and compacting for the programmed cross-bar switch 430 in response to the FDATA stored in BFR 1608 of FIG. 16 is shown in FIG. 17.

Figure 18:
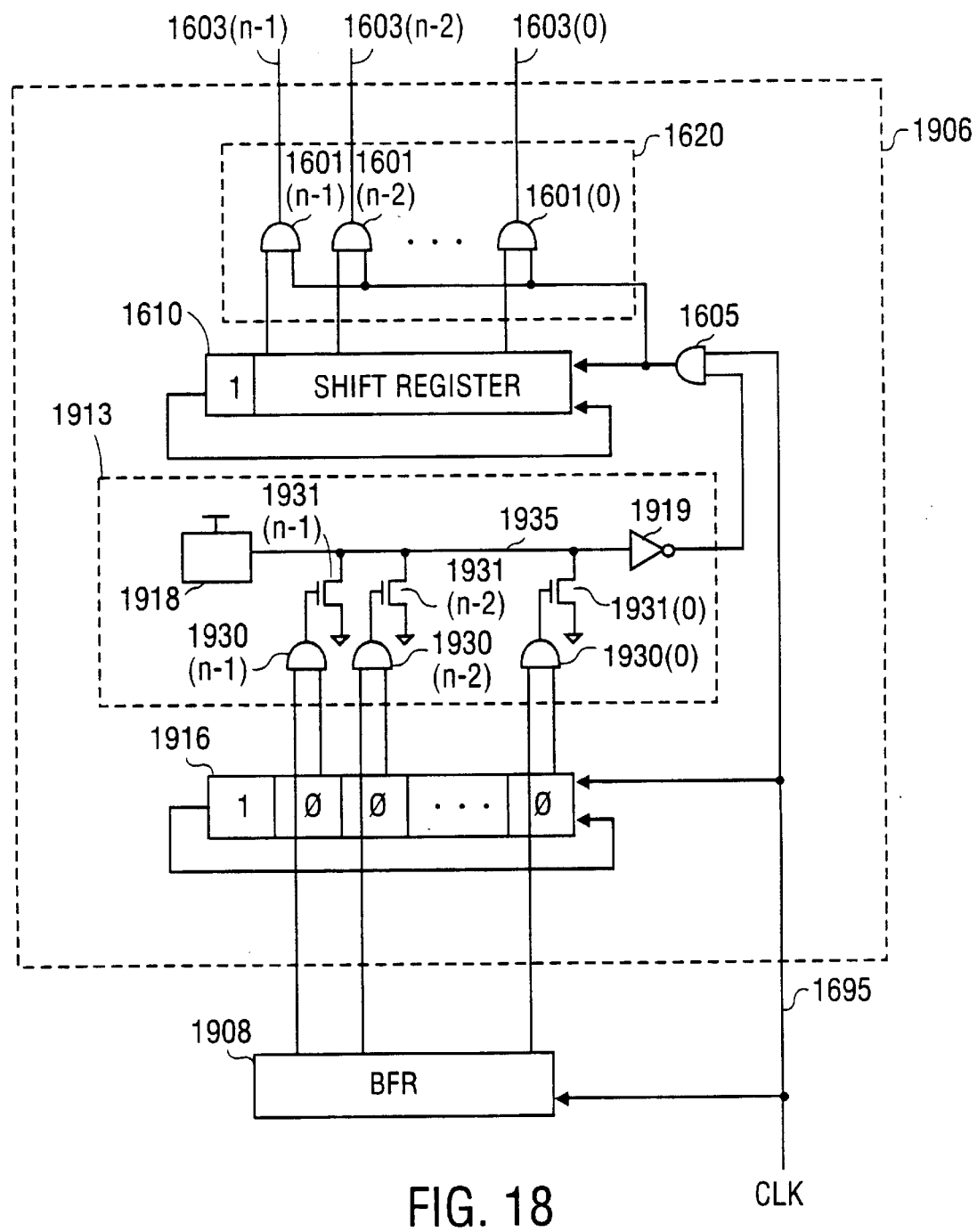
FIG. 18 illustrates an alternative embodiment of a data generator coupled to a block filter register.

FIG. 18 illustrates data generator 1906 and BFR 1908 that are alternative embodiments of data generator 1506 and BFR 1508 of FIG. 15. Data generator 1906 includes shift register 1610, logic circuitry 1620 and AND gate 1605 as previously discussed with respect to FIG. 15, and additionally includes wired OR circuitry 1913 and shift register 1916. Wired OR circuitry 1913 includes an AND gate 1930 and pull-down transistor 1931 pair coupled to receive a different FDATA bit of BFR 1908 and a corresponding bit from shift register 1916. BFR 1908 outputs, in parallel, all of its bit position data to wired OR circuitry 1913. Wired OR circuitry 1913, in turn, controls the shifting operation of shift register 1610. The output of wired OR circuitry 1913 is coupled to signal line 1935, which is coupled to a pre-charge (PC) circuit 1918 and the input of inverter 1919. The output of inverter 1919 is coupled to an input of AND gate 1905. In an alternative embodiment, the FDATA stored in BFR 1608 may be complemented and inverter 1919 omitted.

Shift register 1916 shifts a "1" through its bit positions on each clock of CLK. The outputs of AND gates 1930 are coupled to the gates of pull-down transistors 1931 such that signal line 1935 is pulled low and shift register 1610 enabled to shift if the corresponding bit positions in each of BFR 1908 and shift register 1916 are "1"s. In this manner, shift register 1916 and the FDATA stored in BFR 1908 determine which of the data that is input to wired OR circuitry 1913 clocks shift register 1610 on any given clock cycle.

Figure 19:
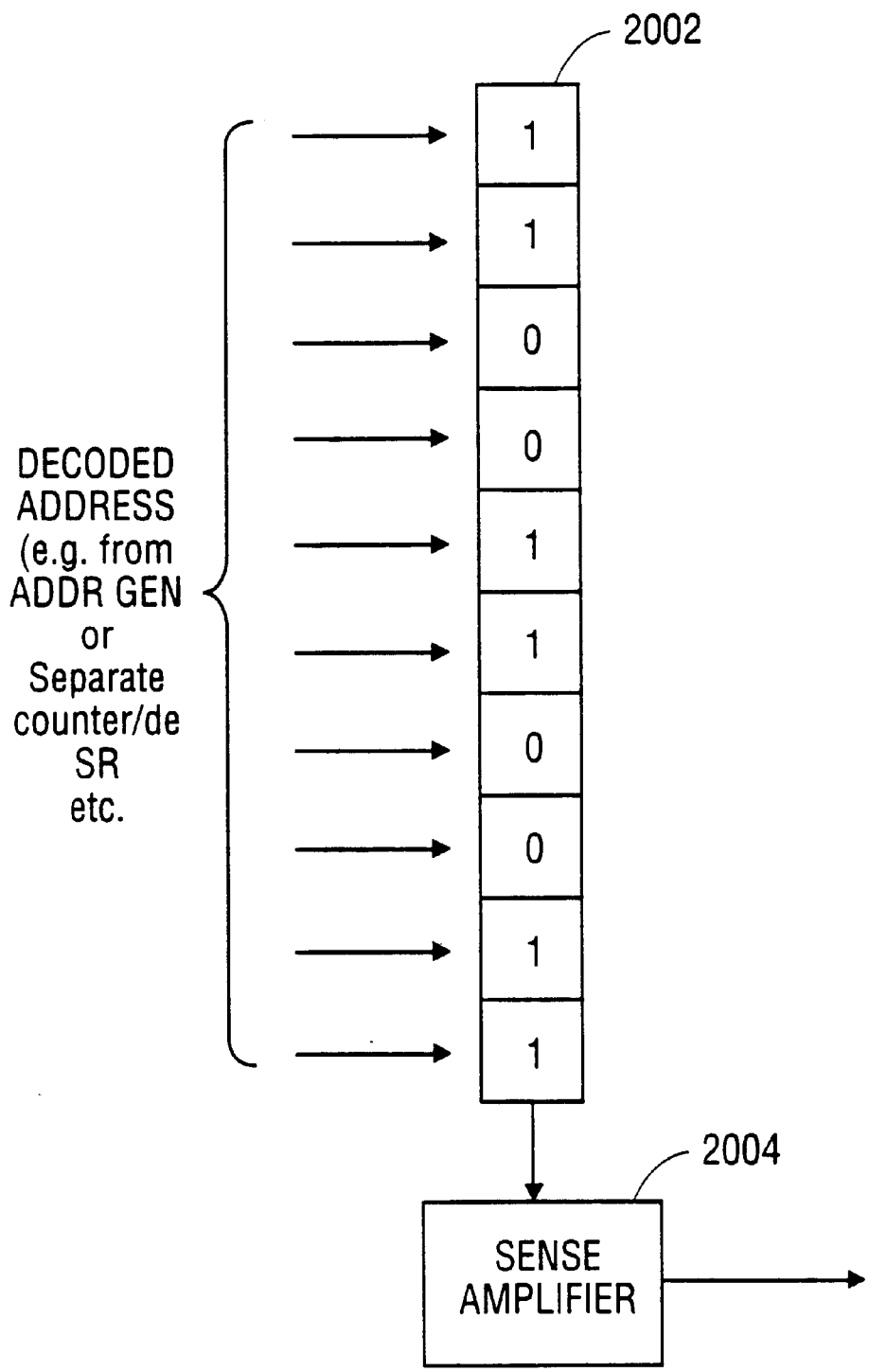
FIG. 19 illustrates one embodiment of block filter register coupled to a sense amplifier.

FIG. 19 illustrates that BFR 1508 may be implemented also as a single column random access memory (RAM) 2002 having multiple rows to store the filter mask bit pattern FDATA. A desired bit location in the SRAM may be accessed by inputting a decoded row address (e.g., from address generator 1206 of FIG. 14). A sense amplifier (S/A) 2004 is coupled to the rows of the RAM to output the data value stored at that the accessed bit location. The output of sense amplifier 2004 may be coupled, for example, to an input of AND gate 1605. RAM 2002 is known in the art; accordingly, a detailed discussion is not provided herein. Each of the rows of RAM 2002 may be sequenced using a counter and a decoder such as counter 1302 and decoder 1304 discussed in relation to FIG. 12, or by other means, for example, using shift register 1402 of FIG. 13.

Figure 20:
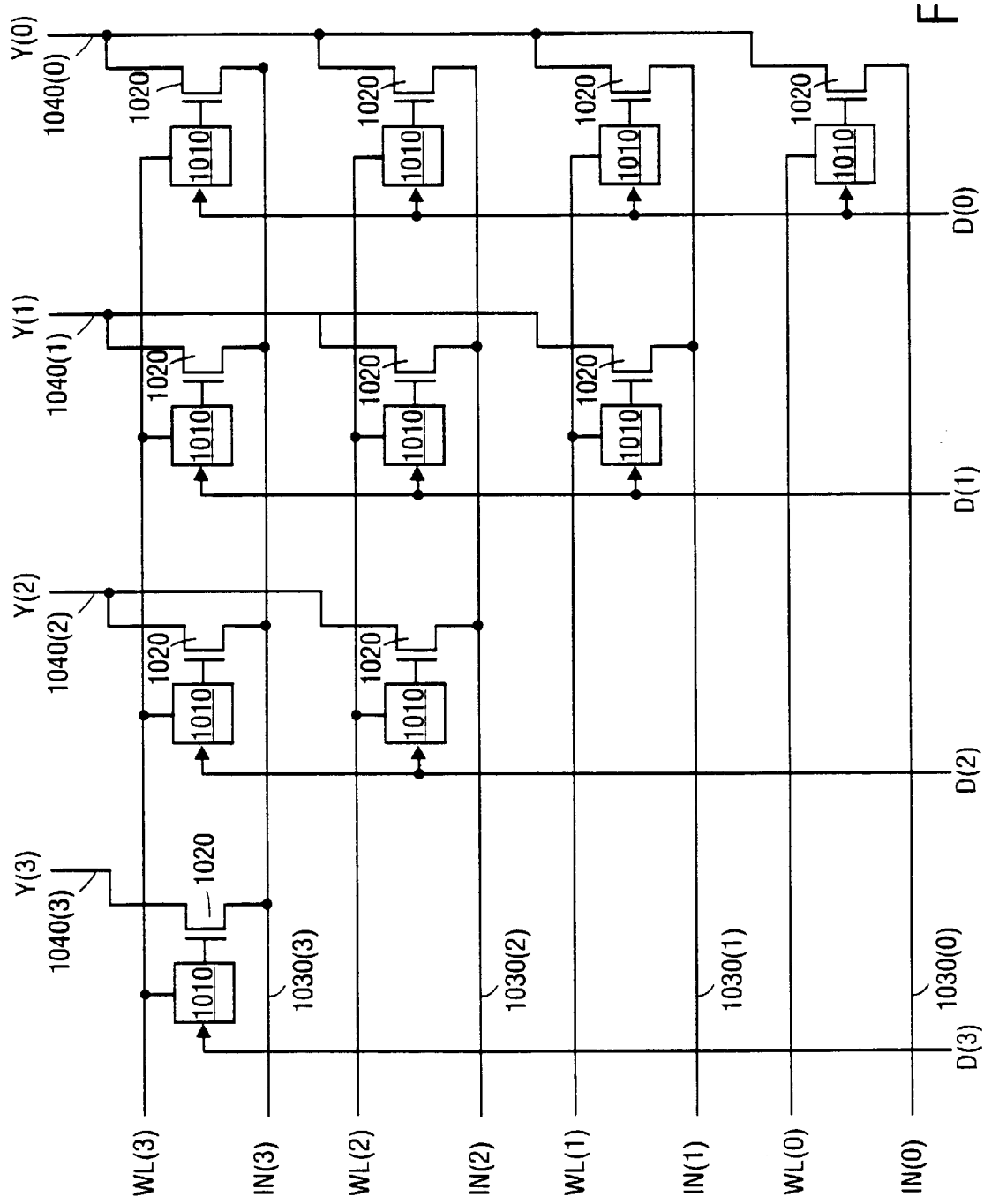
FIG. 20 illustrates one embodiment of a cross-bar switch.

As mentioned above, cross-bar switch 430 may be a full cross-bar switch (e.g., as shown in FIG. 9), or may be modified so as to only use interconnects needed to establish connections. For the embodiments of the data program circuit 1204 illustrated in FIGS. 11–19 that program cross-bar switch 430 to filter and compact input data from higher bit positions to lower bit positions of the output string, only a portion of the cross-bar switch 1000 of FIG. 9 may only be needed as shown in FIG. 20. FIG. 20 shows only four rows and four columns of the modified cross-bar switch, but any number of rows and columns can be used. Additionally, FIG. 20 shows that each of the rows of memory storage elements 1010 are coupled to a word line (WL) to enable the elements to communicate data over one or more bit lines represented as D(0)-D(3). Each of the bit lines communicates a bit of the program data PDATA.

Figure 21:
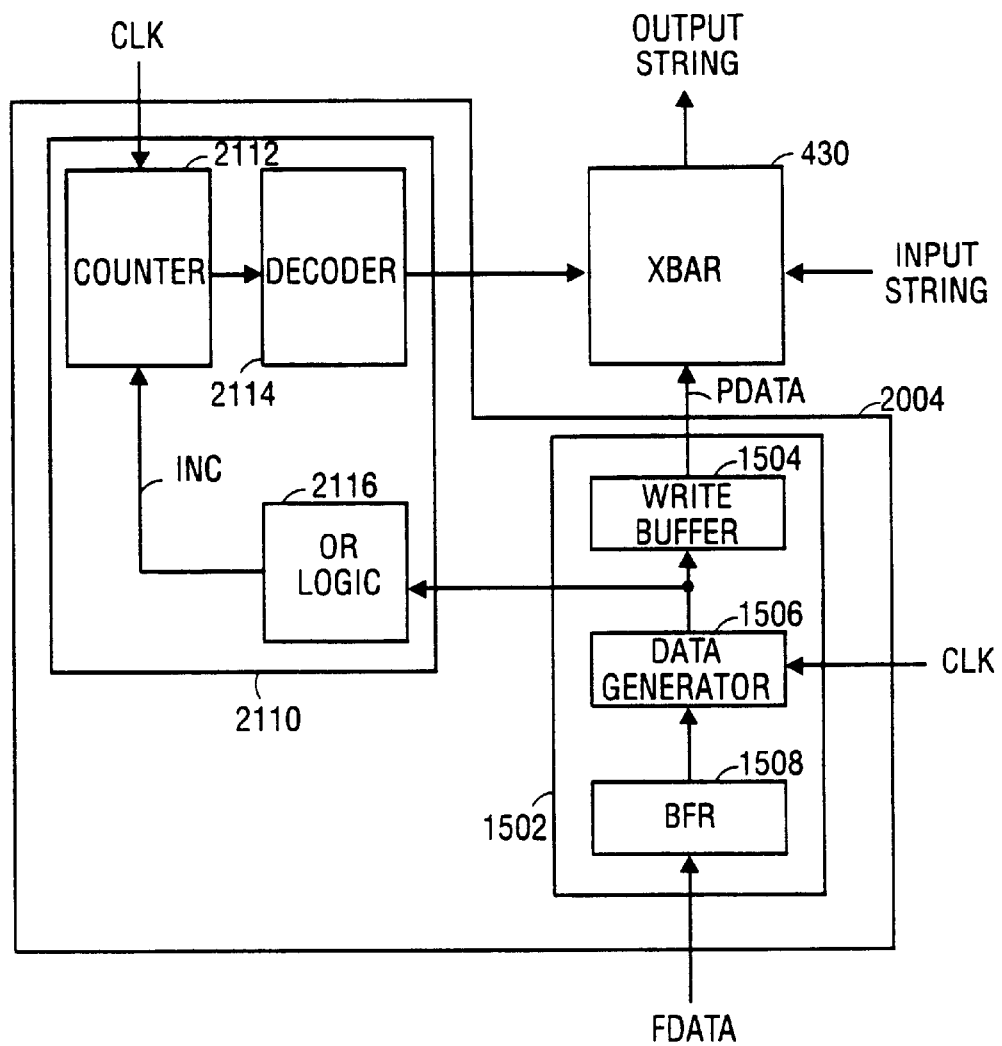
FIG. 21 illustrates another embodiment of a filter circuit.

FIG. 21 illustrates programming circuit 2004, which is another embodiment of programming circuit 440 of FIG. 11. In this embodiment, programming circuit 2004 includes address generator 2110 and program data generator 1502 of FIG. 14. Address generator 2110 includes counter 2112, decoder 2114, and OR logic 2116. During programming, address generator 2110 conditionally sequences through rows of cross-bar switch 430 and programs a connection based on the FDATA stored in BFR 1508. For example, when a particular FDATA bit indicates that a connection is to be established for a selected row in cross-bar switch 430, data generator 1506 outputs at least one signal to write buffer 1504 and OR logic 2116 that has a logic "1" state. In response, OR logic 2116 asserts the increment signal INC to an appropriate logic state such that counter 2112 updates its count in response to the clock signal CLK. The output of the counter is decoded by decoder 2114 to select a new row in cross-bar switch 430. For another embodiment, the increment signal may be a decrement signal to decrement counter 2112. For another embodiment, counter 2112 and decoder 2114 may be replaced by a shift register that is updated to select a row when INC is asserted to the appropriate logic state and CLK is toggled.

Figure 22:
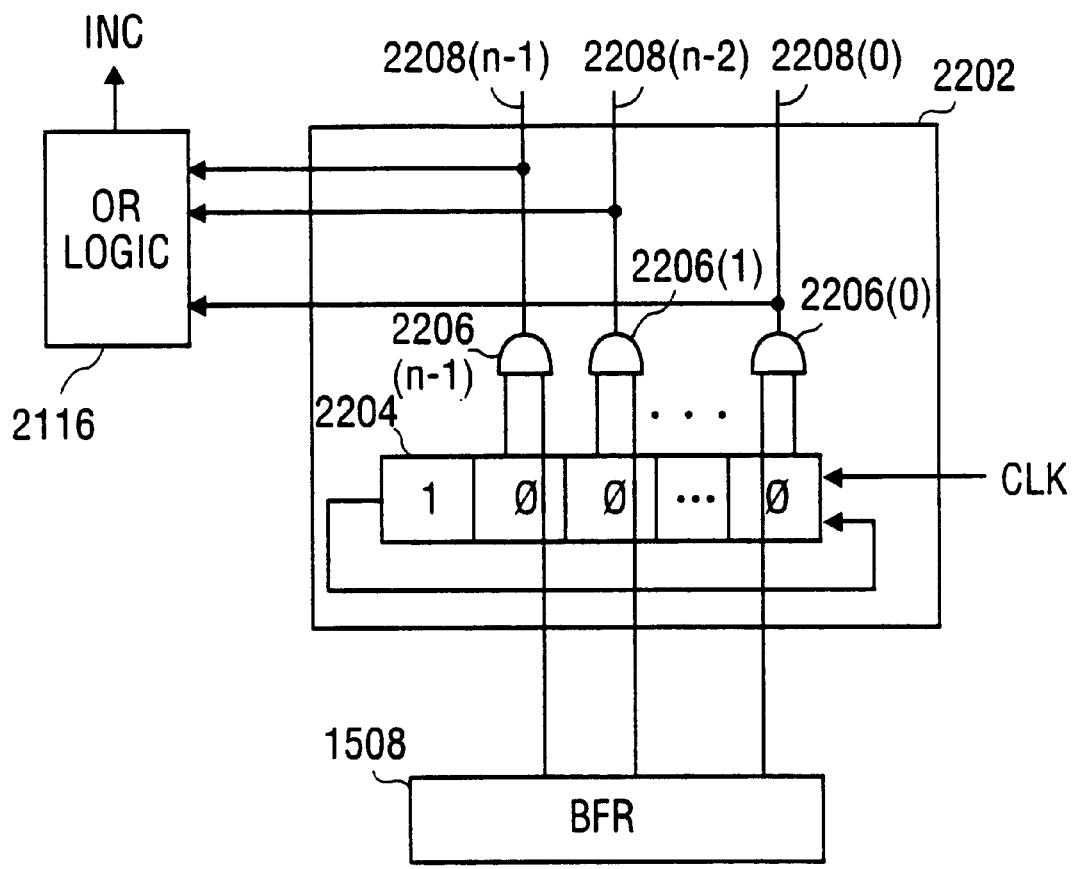
FIG. 22 illustrates one embodiment of the data generator of FIG. 21 coupled to OR logic and a block filter register

FIG. 22 illustrates data generator 2202 that is one embodiment of data generator 1506 of FIG. 21. Data generator 2202 includes a shift register 2204 and AND gates 2206(0)-2206(n-1). Each AND gate 2206(0)-2206(n-1) is coupled to receive corresponding bits from shift register 2204 and BFR 1508, and to generate a plurality of PDATA signals on signal lines 2208(0)-2208(n-1). The PDATA signals are provided to write buffer circuitry 1504 and to OR logic 2116.

For this embodiment, a logic "1" state is shifted across the bit positions of shift register 2204 and logically ANDed with corresponding FDATA bits in BFR 1508 by AND gates 2206(0)-2206(n-1). When an FDATA bit is in a logic "1" state, and the corresponding bit in shift register 2204 is also a logic "1" state, the corresponding AND gate 2206 will generate a PDATA signal that will cause the corresponding row and column interconnection in cross-bar switch 430 to be selected and programmed. All other columns for a selected row will be not be programmed or programmed to logic "0" states so as not to establish connections. Additionally, if one of AND gates 2206 outputs a PDATA signal with a logic "1" state, OR logic 2116 will cause the next row to be selected on the next clock cycle to sequence to a new row for programming.

Figure 23:
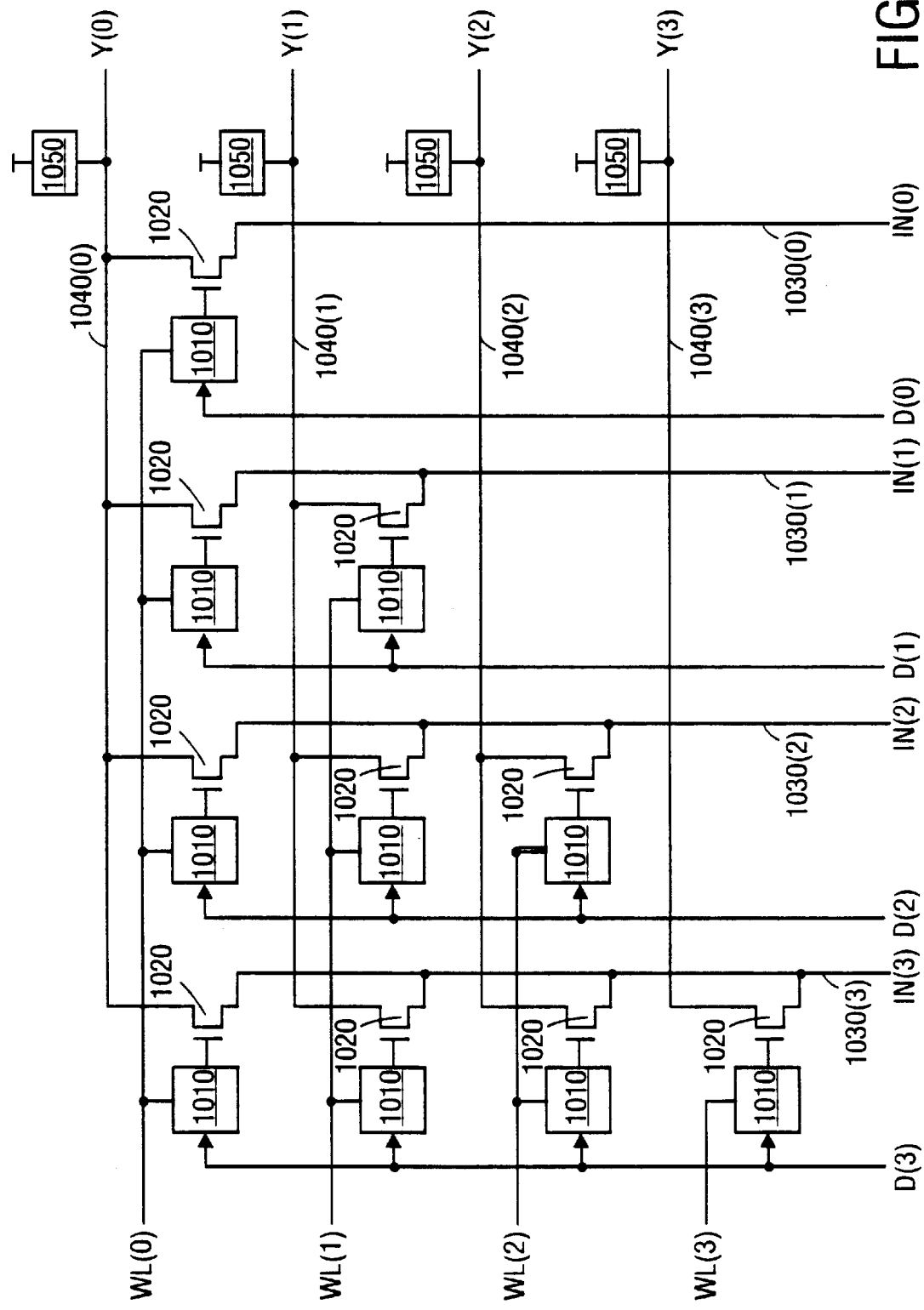
FIG. 23 illustrates another embodiment of cross-bar switch.

As mentioned above, cross-bar switch 430 may be a full cross-bar switch (e.g., as shown in FIG. 9), or may be modified so as to only use interconnects needed to establish connections. For the embodiments of the data program circuit 1504 illustrated in FIGS. 21 and 22 that program cross-bar switch 430 to filter and compact input data from higher bit positions to lower bit positions of the output string, only a portion of the cross-bar switch 1000 of FIG. 9 may only be needed as shown in FIG. 23. FIG. 23 shows only four rows and four columns of the modified cross-bar switch, but any number of rows and columns can be used. Additionally, FIG. 2230 shows that each of the rows of memory storage elements 1010 are coupled to a word line (WL) to enable the elements to communicate data over one or more bit lines represented as D(0)-D(3). Each of the bit lines communicates a bit of the program data PDATA.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
   a plurality of content addressable memory blocks; and
   a plurality of filter circuits, each of the plurality of filter circuits coupled to a corresponding one of the plurality of content addressable memory blocks, each of the plurality of filter circuits being configured to receive a common input string and transmit a filtered comparand string to the corresponding one of the plurality of content addressable memory blocks, wherein each of the plurality of filter circuits comprise a cross-bar switch configured to receive the common input string, wherein each of the plurality of filter circuits further comprise a programming circuit coupled to the cross-bar switch and wherein the programming circuit is configured to receive filter data to program the cross-bar switch to generate the filtered comparand string from the common input string.

2. The apparatus of claim 1, wherein the plurality of content addressable memory blocks is configured to perform concurrent lookups.

3. The apparatus of claim 1, wherein the programming circuit comprises:
   a data generator coupled to the cross-bar switch;
   a block filter register coupled to the data generator, the block filter register to store the filter data; and
   an address generator coupled to the cross-bar switch.

4. The apparatus of claim 3, wherein the data generator comprises:
   a shift register coupled to the block filter register; and
   a logic circuit coupled to the shift register.

5. The apparatus of claim 4, wherein the shift register has a plurality of bit positions and wherein the shift register is configured to shift a predetermined bit value through the plurality of bit positions based on the filter and a clock signal.

6. The apparatus of claim 5, wherein the logic circuit is configured to receive bit values from the plurality of bit positions of the shift register and output the bit values based on the clock signal.

7. The apparatus of claim 3, wherein the data generator comprises:
   a second shift register having a plurality of bit positions;
   a wired logic gate coupled to the first shift register, the wired logic gate coupled to the block filter register to receive the filter data, the wired logic gate coupled to the second shift register to control the shifting of a predetermined bit value through the second shift register, the second shift register configured to shift the predetermined bit value through the plurality of bit positions based on the filter data and a clock signal; and
   a logic circuit coupled to receive an output of the second shift register and transmit the output to the write buffer circuit.

8. The apparatus of claim 3, wherein the block filter register is a multiple row, single column random access memory.

9. The apparatus of claim 3, wherein the address generator comprises:
   a counter having a control input and a counter output; and
   a decoder coupled to the output of the counter and the cross-bar switch.

10. The apparatus of claim 9, further comprising OR circuitry having an output coupled to the control input of the counter and a plurality of inputs coupled to the data generator.

11. The apparatus of claim 3, wherein the address generator comprises a shift register.

12. The apparatus of claim 11, wherein the address generator further comprises OR circuitry having an output coupled to the shift register and a plurality of inputs coupled to the data generator.

13. An apparatus, comprising:
    a plurality of content addressable memory blocks; and
    a plurality of filter circuits, each of the plurality of filter circuits coupled to a corresponding one of the plurality of content addressable memory blocks, each of the plurality of filter circuits being configured to receive a common input string and transmit a filtered comparand string to the corresponding one of the plurality of content addressable memory blocks, wherein each of the plurality of filter circuits comprise a cross-bar switch configured to receive the common input string, wherein the cross-bar switch comprises a plurality of memory storage cells each coupled to a switch circuit to selectively enable an input of the cross-bar switch to pass to an output of the cross-bar switch.

14. The apparatus of claim 13, wherein the plurality of filter circuits are programmable.

15. An apparatus, comprising:
    a processor to transmit an input string;
    a plurality of filter circuits coupled to receive the input string from the processor; and
    a plurality of content addressable memory blocks, wherein each of the plurality of filter circuits are coupled to a corresponding one of the plurality of content addressable memory blocks, each of the plurality of filter circuits being configured to receive the input string and transmit a filtered comparand string to the corresponding one of the plurality of content addressable memory blocks, wherein each of the plurality of filter circuits comprises a cross-bar switch configured to receive the input string, wherein each of the plurality of filter circuits further comprise a programming circuit coupled to the cross-bars switch, each of the programming circuits configured to receive filter data to program the cross-bar switch to generate the filtered comparand string from the input string.

16. The apparatus of claim 15, wherein the plurality of content addressable memory blocks is configured to perform concurrent lookups.

17. The apparatus of claim 15, wherein the programming circuit comprises:
    a data generator coupled to the cross-bar switch;
    a block filter register coupled to the data generator, the block filter register to store the filter data; and
    an address generator coupled to the cross-bar switch.

18. The apparatus of claim 17, wherein the data generator comprises:

a shift register coupled to the block filter register, the shift register having a plurality of bit positions, the shift register being configured to shift a predetermined bit value through the plurality of bit positions based on the filter data and a clock signal; and a logic circuit coupled to the shift register, the logic circuit being configured to receive bit values from the plurality of bit positions of the shift register and output the bit values based on the clock signal.

19. The apparatus of claim 17, wherein the data generator comprises:

a first shift register;

a second shift register having a plurality of bit positions;

a wired logic gate coupled to the first shift register, the wired logic gate coupled to the block filter register to receive the filter data, the wired logic gate coupled to the second shift register to control the shifting of a predetermined bit value through the second shift register, the second shift register configured to shift the predetermined bit value through the plurality of bit positions based on the filter data and a clock signal; and a logic circuit coupled to receive an output of the second shift register and transmit the output to the write buffer circuit.

20. The apparatus of claim 17, wherein the block filter register is a multiple row, single column random access memory.

21. The apparatus of claim 17, wherein the programming circuit comprises:

a counter having a control input and a counter output; and a decoder coupled to the output of the counter and the cross-bar switch.

22. The apparatus of claim 21, further comprising OR circuitry having an output coupled to the control input of the counter and a plurality of inputs coupled to the data generator.

23. The apparatus of claim 17, wherein the address generator comprises a shift register.

24. The apparatus of claim 23, wherein the address generator further comprises OR circuitry having an output coupled to the shift register and a plurality of inputs coupled to data generator.

25. An apparatus, comprising:

a processor to transmit an input string;

a plurality of filter circuits coupled to receive the input string from the processor; and a plurality of content addressable memory blocks, wherein each of the plurality of filter circuits are coupled to a corresponding one of the plurality of content addressable memory blocks, each of the plurality of filter circuits being configured to receive the input string and transmit a filtered comparand string to the corresponding one of the plurality of content addressable memory blocks, wherein each of the plurality of filter circuits comprises a cross-bar switch configured to receive the input string, wherein the cross-bar switch comprises a plurality of memory storage cells each coupled to a switch circuit to selectively enable an input of the cross-bar switch to pass to an output of the cross-bar switch.

26. The apparatus of claim 25, wherein each of the plurality of content addressable memory blocks reside on a different integrated circuit substrate.

27. The apparatus of claim 25, wherein each of the plurality of content addressable memory blocks reside on a common integrated circuit substrate.

28. The apparatus of claim 25, wherein the plurality of filter circuits are programmable.

29. A method, comprising:

filtering a common input string to generate a first filtered string and a second filtered string, wherein the first filtered string is different than the second filtered string;

compacting the first filtered string, wherein the first filtered string has bit positions and wherein compacting comprises shifting the bit positions relative to each other to generate a comparand string having continuously filled bit positions; and performing lookups in first and second content addressable memory blocks, respectively, using the first and second filtered strings, respectively.

30. The method of claim 29, wherein the lookups are performed concurrently.

31. The method of claim 29, wherein the filtering of the common input string to generate the first and second filtered strings is performed concurrently using different filtering circuits.

32. The method of claim 29, wherein compacting further comprises shifting bit positions of the first and second filtered strings to lower bit positions.

33. The method of claim 32, wherein the first filtered string is filtered by a cross-bar switch.

34. The method of claim 33, further comprising programming the cross-bar switch.

35. The method of claim 34, wherein the programming comprises:

(a) determining whether a connection between a bit position of the common input string and a bit position of the first filtered string is to be established;

(b) establishing a connection in the cross-bar switch based on the determination in step (a);

(c) sequencing to a next bit position of the common input string when a connection is established in step (b); and (d) not sequencing to the next bit position of the common input string when a connection is not established in step (b).

36. The method of claim 35, further comprising repeating steps (a) through (d).

37. The method of claim 29, further comprising programming first and second filter circuits to generate the first and second filtered strings from the common input-string.

38. The method of claim 37, wherein the programming is done before the filtering.

39. An apparatus, comprising:

means for filtering a common input string to generate a first filtered string and a second filtered string, wherein the first filtered string is different than the second filtered string;

means for compacting the first and second filtered strings; and means for performing lookups in first and second content addressable memory blocks, respectively, using the first and second filtered strings, respectively.

40. The apparatus of claim 39, further comprising means for performing the lookups concurrently.

41. The apparatus of claim 39, further comprising means for generating a comparand string having continuously filled bit positions.

42. The apparatus of claim 39, further comprising:

means for translating a first input bit of a first comparand from a first bit position to a different bit position of a second comparand; and means for comparing the second comparand with data stored in a first content addressable memory array of the first content addressable memory block.

43. The apparatus of claim 42, further comprising:

means for translating a second input bit of the first comparand from a second bit position to a different bit position of a third comparand; and means for comparing the third comparand with data stored in a second content addressable memory array of the second content addressable memory block.

44. An apparatus, comprising:

a content addressable memory;

a cross-bar switch coupled to the content addressable memory, the cross-bar switch configured to receive an input string and transmit a filtered comparand string to the content addressable memory; and a programming circuit coupled to the cross-bar switch and wherein the programming circuit is configured to receive filter data to program the cross-bar switch to generate the filtered comparand string from the input string, wherein the programming circuit comprises:
a data generator coupled to the cross-bar switch;
a block filter register coupled to the data generator, the block filter register to store filter data; and
an address generator coupled to the cross-bar switch.

45. An apparatus, comprising:

a plurality of content addressable memory blocks; and a plurality of filter circuits, each of the plurality of filter circuits coupled to a corresponding one of the plurality of content addressable memory blocks, each of the plurality of filter circuits being configured to receive a common input string and transmit a filtered comparand string to the corresponding one of the plurality of content addressable memory blocks, wherein each of the plurality of filter circuits comprise:
a cross-bar switch configured to receive the common input string; and
a programming circuit coupled to the cross-bar switch, wherein the programming circuit is configured to receive filter data to program the cross-bar switch to generate the filtered comparand string from the common input string, and wherein the programming circuit comprises:
write buffer circuitry coupled to the cross-bar switch;
a data generator coupled to the write buffer circuitry;
a block filter register coupled to the data generator, the block filter register to store a bit data pattern to establish connections in the cross-bar switch; and
an address generator coupled to the cross-bar switch, wherein the address generator comprises:
a counter having a control input and a counter output;
a decoder coupled to the output of the counter and the cross-bar switch; and OR circuitry having an output coupled to the control input of the counter and a plurality of inputs coupled to data generator.

46. An article comprising a machine readable medium that stores data representing an integrated circuit, comprising:

a plurality of content addressable memory blocks; and a plurality of filter circuits, each of the plurality of filter circuits coupled to a corresponding one of the plurality of content addressable memory blocks, each of the plurality of filter circuits being configured to receive a common input string and transmit a filtered comparand string to the corresponding one of the plurality of content addressable memory blocks, wherein each of the plurality of filter circuits comprise a cross-bar switch configured to receive the common input string, wherein each of the plurality of filter circuits further comprise a programming circuit coupled to the cross-bar switch and wherein the programming circuit is configured to receive filter data to program the cross-bar switch to generate the filtered comparand string from the common input string.

47. The article of claim 46, wherein the plurality of content addressable memory blocks is configured to perform concurrent lookups.

48. The article of claim 46, wherein the programming circuit comprises:

a data generator coupled to the cross-bar switch;

a block filter register coupled to the data generator, the block filter register to store the filter data; and an address generator coupled to the cross-bar switch.

49. An apparatus, comprising:

a plurality of content addressable memory blocks; and a plurality of filter circuits, each of the plurality of filter circuits coupled to a corresponding one of the plurality of content addressable memory blocks, each of the plurality of filter circuits being configured to receive a common input string and transmit a filtered comparand string to the corresponding one of the plurality of content addressable memory blocks, wherein the plurality of filter circuits are pre-programmable, wherein each of the plurality of filter circuits further comprise a programming circuit coupled to a cross-bar switch and wherein the programming circuit is configured to receive filter data to program the cross-bar switch to generate the filtered comparand string from the common input string.

50. The apparatus of claim 49, wherein the plurality of content addressable memory blocks is configured to perform concurrent lookups.

* * * * *